United States Patent
Hoyle et al.

(10) Patent No.: US 6,555,593 B1
(45) Date of Patent: Apr. 29, 2003

(54) PHOTOPOLYMERIZATION COMPOSITIONS INCLUDING MALEIMIDES AND PROCESSES FOR USING THE SAME

(75) Inventors: Charles E. Hoyle, Hattiesburg, MS (US); Rajamani Nagarajan, Oceans Springs, MS (US); Christopher W. Miller, Hattiesburg, MS (US); Shan Christopher Clark, Hattiesburg, MS (US); E. Sonny Jönsson, Stockholm (SE); Liying Shao, Queensland (AU)

(73) Assignee: Albemarle Corporation, Baton Rouge, LA (US)

( * ) Notice: Subject to any disclaimer, the term of this patent is extended or adjusted under 35 U.S.C. 154(b) by 0 days.

(21) Appl. No.: 09/240,020

(22) Filed: Jan. 29, 1999

Related U.S. Application Data
(60) Provisional application No. 60/073,100, filed on Jan. 30, 1998.

(51) Int. Cl.$^7$ ............... C08F 2/50; C08F 2/48; C08F 2/46
(52) U.S. Cl. ............ 522/63; 522/167; 522/166; 522/178; 522/181; 522/182; 522/33; 522/46
(58) Field of Search ............... 522/167, 166, 522/63, 178, 181, 182, 33, 46

(56) References Cited

U.S. PATENT DOCUMENTS

| | | | |
|---|---|---|---|
| 3,129,225 A | 4/1964 | Shapiro et al. | 260/247.2 |
| 3,729,814 A | 5/1973 | Wright et al. | 29/577 |
| 3,850,955 A | 11/1974 | Bublitz | 260/326.5 |
| 3,855,180 A | 12/1974 | Schroeter | |
| 3,890,270 A | 6/1975 | Minieri et al. | 260/45.81 |
| 4,025,409 A | 5/1977 | McGinniss | |
| 4,071,425 A | 1/1978 | Guarino et al. | |
| 4,072,524 A | 2/1978 | Kleeberg et al. | |
| 4,266,005 A | 5/1981 | Nakamura et al. | |
| 4,276,352 A | 6/1981 | Green | |
| 4,287,294 A | 9/1981 | Rubner et al. | 430/306 |
| 4,329,556 A | 5/1982 | Rubner et al. | 548/549 |
| 4,383,903 A * | 5/1983 | Ayano et al. | 204/159.16 |
| 4,416,975 A | 11/1983 | Green et al. | 430/327 |
| 4,544,621 A | 10/1985 | Roth | 430/271 |
| 4,626,497 A | 12/1986 | Roth et al. | 430/293 |
| 4,656,292 A | 4/1987 | Roth | 548/548 |
| 4,886,842 A * | 12/1989 | Drain et al. | 522/103 |
| 5,087,552 A | 2/1992 | Horigome et al. | |
| 5,171,655 A | 12/1992 | Aoshima | 430/138 |
| 5,196,550 A | 3/1993 | Long, II et al. | 548/548 |
| 5,319,101 A | 6/1994 | Long, II et al. | 548/548 |
| 5,446,073 A | 8/1995 | Jonsson et al. | 522/104 |
| 6,034,150 A * | 3/2000 | Hoyle et al. | 522/167 |
| 6,153,662 A * | 11/2000 | Miller et al. | 522/167 |

FOREIGN PATENT DOCUMENTS

| | | |
|---|---|---|
| DE | 4 024 710 | 2/1991 |
| EP | 0 094 913 | 11/1983 |
| EP | 0 304 174 | 7/1988 |
| EP | 0 318 893 A | 6/1989 |
| EP | 0 410 794 | 1/1991 |
| FR | 2 293 467 | 7/1976 |
| FR | 2 438 282 | 4/1980 |
| JP | 62010179 A | 1/1987 |
| JP | 3 084 016 | 4/1991 |
| JP | 0 4161 413 | 6/1992 |
| WO | WO 99/03930 | 1/1999 |

OTHER PUBLICATIONS

International Search Report for PCT/US 99/01989 mailed May 21, 1999 by J. M. Dupart.

Patent Abstracts of Japan, vol. 018, No. 201 (C–1188), Apr. 8, 1994 & JP 06 001944 A (Hitachi Chem Co. Ltd), Jan. 11, 1994.

Patent Abstracts of Japan, vol. 005, No. 168 (C–077), Oct. 27, 1981 & JP 56 098245 A (Mitsubishi Gas Chem Co. Inc), Aug. 7, 1981.

Woo–Sik Kim et al., "Synthesis and Photocrosslinking of Maleimide–Type Polymers," *Macromol. Rapid Commun.*, vol. 17, No. 11, pp. 835–841, Nov., 1996.

Chemical Abstracts, vol. 91, No. 6, Aug. 6, 1979, Columbus, Ohio, US; abstract No. 39958x, Shulyndin S.V. et al., "Synthesis and Properties of Polymers Containing Phosphorous and Nitrogen," p. 39962.

J. Put and F.C. DeSchryver, "Photochemistry of Nonconjugated Bichromophoric Systems, Intramolecular Photocycloaddition of N,N'–Alkylenedimaleimides in Solution," *J. Ameri. Chem. Soc.*, 95, 140, Jan. 10, 1973.

F.C. DeSchryver, N. Boens and G. Smets; "Photopolymerization V. Unsensitized Solution Photocyclopolymerization of N, N'–Alkylenedimaleimides," *Journal of Polymer Science*, vol. 10, 1687–1699 (1972).

F.C. DeSchryver, W.J. Feast and G. Smets, "Photocycloaddition Polymerization, I. Preparation and Characterization of Poly–N, N'–polymethylenebisdichloromaleimides," *Journal of Polymer Science*, vol. 8, 1939–1948 (1970).

N. Boens, F.D. DeSchryver, and G. Smets, "Solid–State Ultraviolet Irradiation of Some Maleimides and Bismaleimides," *Journal of Polymer Science*, vol. 13, 201–213 (1975).

H. Zorr and H. Heusinger, "Intermediates of Radiation–Induced Polymerisation of Maleimides Studied by ESR," *European Polymer J.*, 14, 89 (1978).

Miller, et al., Polymer Preprints, 38(2), 454–55 (1997).

Miller et al.., *Polymer Preprints*, 37(2), 346 (1996).

M. Yamada et al., *J. Polym. Sci.*, Part B, 6, 883(1968).

(List continued on next page.)

*Primary Examiner*—James J. Seidleck
*Assistant Examiner*—Sanza L. McClendon
(74) *Attorney, Agent, or Firm*—Alston & Bird LLP

(57) ABSTRACT

Photopolymerization compositions which include maleimides and processes using the same are disclosed. Polymerization of compositions which include maleimides in combination with a benzophenone compound/hydrogen atom donor sensitizer system may be activated by irradiating the composition with radiation.

64 Claims, 5 Drawing Sheets

OTHER PUBLICATIONS

F.C. DeSchryver et al., *J. Am. Chem. Soc.*, 96, 6463:6469 (1974). K. Meier et al.,*J. Photochem.*, 35, 353–366. 1986.
K. Meier et al.,*J. Photochem.*, 35, 353–366 (1986.
Shimose, et al., *Polymer Preprints*, vol. 36, 1(1995).
Hoyle et al. *Academic Day Proceedings Radtech Europe '97*, pp. 115–120.
Jönsson et al., *PMSE Preprints*, 74, 319 (1996).
Decker et al., *Polym. Mater. Sci. Eng.*, 75, 198 (1996).
Clark et al., *Polym. Prep.*, 37(2), 348 (1996).
Jönsson et al., *Proceedings Vol. I, Radtech North America '96*, 377–92, Nashville, TN (1996).
Jönsson., et al., *Nuclear Instruments and Methods in Physics Research B*, 131, 276–290 (1997).
Hoyle et al., *Polymer Communications*, vol. 38, No. 22, pp. 5696–4697 (1997).
Hoyle et al., *PMSE*, 77, 373–74 (1997).
Hoyle et al., *Proceedings, Radtech Asia '97*, 216–219, Yokahama, Japan (Nov. 1997).

E.J. Corey et al., "Enantioselective total synthesis of Gracilins B and C using catalytic asymmetric Diels–Alder methodology," *Journal of the American Chemical Society*, vol. 117, No. 37, Sep. 20, 1995, pp. 9616–9617, XP002076382.

N.A. Kalinina et al., "Effect of maleic acid imides on rheological properties and radiation–induced three–dimensional polymerization of solid epoxy acrylate oligomer," *Russian Journal of Applied Chemistry*, vol. 70, No. 4, Apr. 1997, pp. 643–647, XP002076383.

Chemical Abstracts, vol. 79, No. 4, Jul. 30, 1973, Columbus, Ohio, US; abstract No. 19978c, S. Kritskaya et al., "Effect of maleimides on radiation vulcanization of cis–butadiene and butadiene–styrene rubbers," page 65, XP002076384 see abstract & Kauch. Rezina, vol. 32, 1973, pp. 21–22.

* cited by examiner

PHOTOPOLYMERIZATION COMPOSITIONS INCLUDING MALEIMIDES AND PROCESSES FOR USING THE SAME

CROSS-REFERENCE TO RELATED APPLICATION

This application is related to commonly owned copending Provisional Application Ser. No. 60/073,100, filed Jan. 30, 1998, incorporated herein by reference in its entirety, and claims the benefit of its earlier filing date under 35 U.S.C. 119(e).

FIELD OF THE INVENTION

This invention relates generally to photopolymerizable compositions and more particularly to photopolymerizable compositions which include maleimide compounds as a component and methods of using the same.

BACKGROUND OF THE INVENTION

Ethylenically unsaturated compounds, such as acrylate derivatives, can be polymerized by exposure to radiation, typically ultraviolet light, in the presence of a photoinitiating system. Typically, the photoinitiating system includes (1) a compound capable of initiating polymerization of the ethylenically unsaturated compound upon exposure to radiation (a "photoinitiator") and optionally (2) a coinitiator or synergist, that is, a molecule which serves as a hydrogen atom donor. The coinitiators or synergists are typically alcohols, tertiary amines, amides, or ethers which have labile hydrogens attached to a carbon adjacent to a heteroatom. Currently commercially available photoinitiators include benzophenones and derivatives thereof, such as thioxanthone derivatives.

Maleimides, and in particular N-aliphatic and ortho-substituted (i.e. "twisted") N-aromatic maleimides have been investigated as comonomer-photoinitiators of UV-curable acrylic systems. These maleimides have been observed to require the presence of a hydrogen atom-donor synergist (such as an amine, ether, thiol, or the like) to obtain reasonable rates of initiation and polymerization.

J. Put and F. C. De Schryver, "Photochemistry of Non-conjugated Bichromophoric Systems," Journal of the American Chemical Society. 95, 1, 137–45 (1973); "Photocycloaddition Polymerization. I. Preparation and Characterization of Poly-N,N'-polymethylenebisdichloromaleimides," Journal of Polymer Science: Part A-1. 8, 1939–48 (1970); and N. Boens et al., "Solid-State Ultraviolet Irradiation of Some Maleimides and Bismaleimides," Journal of Polymer Science: Polymer Chemistry Edition 13, 210–13 (1975) report studies of the sensitization of maleimides with benzophenone and thioxanthones for the formation of maleimide 2+2 cycloadducts. F. C. De Schryver, et al, "Photochemistry of Nonconjugated Bichromophoric Systems. Photopolymerization of N,N-Alkylenebis (dimethylmaleimides)," Journal of the American Chemical Society 96, 20, 6463–69 (1974) also report the formation polymer networks by the sensitized step-wise 2+2 cycloaddition of maleimides.

SUMMARY OF THE INVENTION

The present invention is directed to photopolymerizable compositions and methods for radiation curing of the same. The compositions of the invention include at least one radiation curable compound. The compositions preferably include ethylenically unsaturated compounds, and in particular, acrylate derivatives.

The compositions further include at least one maleimide which is capable of initiating the photopolymerization of a radiation curable compound. The maleimide can be an alkyl maleimide, functionalized aliphatic maleimide, aromatic maleimide, maleimide, maleic anhydride, or mixtures thereof. The maleimide component can be substantially completely consumed during initiation and photopolymerization (incorporated into the polymer structure).

The composition further includes additional photoactive compounds as sensitizers. Specifically, the composition includes at least one benzophenone compound which is capable of initiating polymerization of the ethylenically unsaturated compound upon exposure to radiation. As used herein, the term "benzophenone compound" includes benzophenone and derivatives thereof, including thioxanthone and derivatives of thioxanthone. In addition, the composition optionally includes at least one coinitiator or synergist as a hydrogen atom donor or an electron donor. The hydrogen atom donor can be present as a separate compound or can be included as a molecular component of the photopolymerizable compound. The synergistic effect described herein which occurs when a sensitizer is used in conjunction with a maleimide in the presence of a hydrogen atom donor has been observed to dramatically increase rates of polymerization of typical acrylic photo-curable systems, as compared to rates obtained using the same acrylic photo-curable system with either maleimide with a hydrogen-atom donor or the sensitizer with a hydrogen-atom donor as the initiating system.

The present invention also provides methods for radiation curing of photopolymerizable compositions of the invention.

BRIEF DESCRIPTION OF THE DRAWINGS

Some of the features and advantages of the invention having been described, others will become apparent from the detailed description which follows, and from the accompanying drawings, in which.

DETAILED DESCRIPTION OF THE INVENTION

Figure 1:
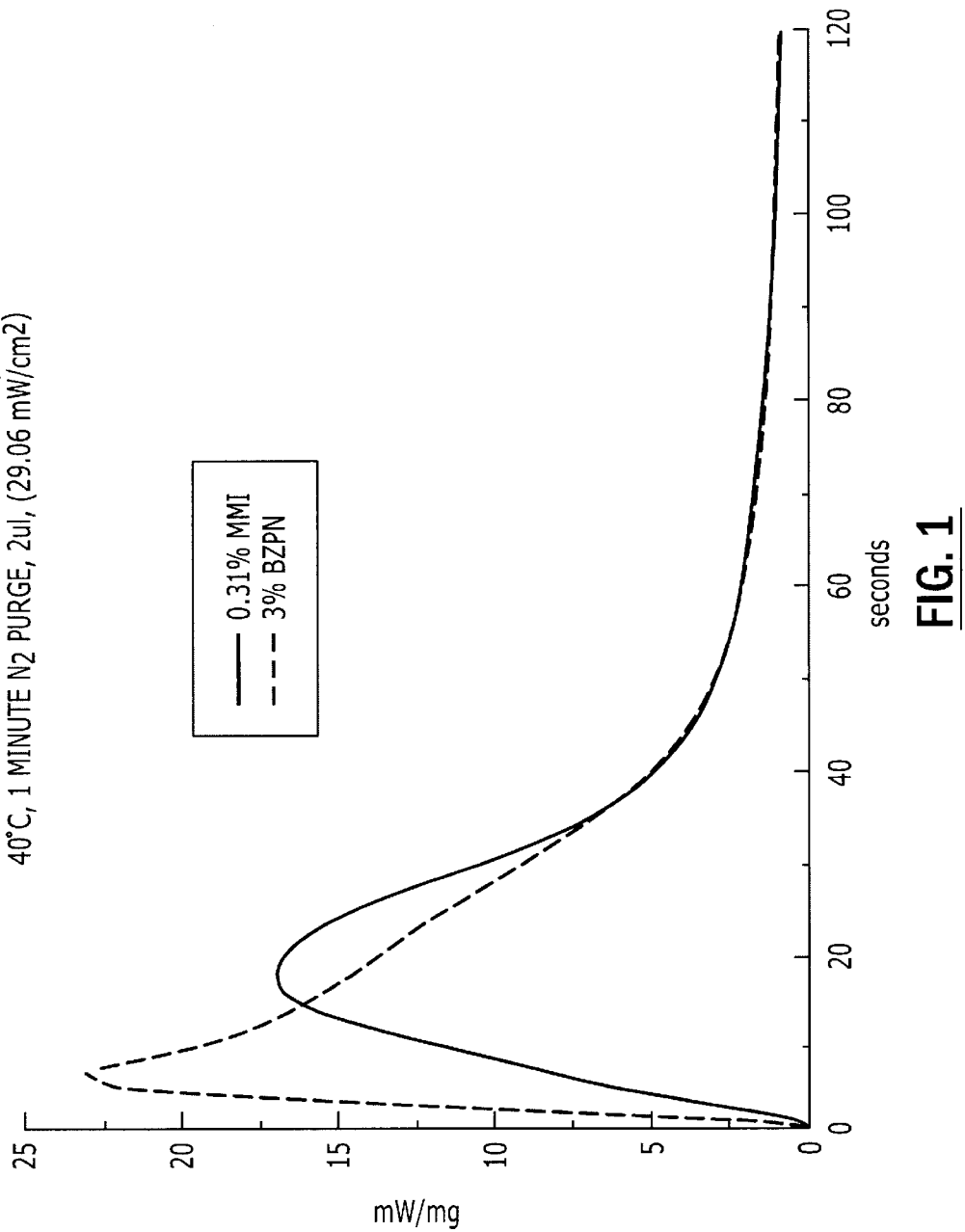
FIG. 1 is a graph illustrating photo-differential scanning calorimetry (DSC) exotherm rates for the photopolymerization of 1,6-hexanediol diacrylate (HDDA) with photoinitiator packages of 3% benzophenone (BZPN)/1% methyl diethanol amine (NMDEA) and 0.31% N-methyl maleimide (MMI)/1% NMDEA.

Maleimides useful in the compositions of the invention include maleimides of the formula

and maleic anhydrides of the formula

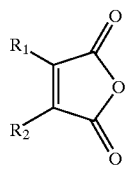

wherein:

each $R_1$ and $R_2$ is independently selected from the group consisting of hydrogen, C1 to C10 alkyl, cycloalkyl, aryl, alkoxy, and halogen, or $R_1$ and $R_2$ together form a fused saturated or unsaturated five or six membered cyclic hydrocarbon or heterocyclic ring system containing one or two O, N or S atoms, optionally substituted with alkyl, aryl, halogen, arylalkyl, alkylaryl, cycloalkyl, alkoxy, heteroatoms, silicon, and the like. Such compounds are commercially available and/or can be prepared using commercially available starting materials using techniques known in the art.

Alkyl maleimides useful in the invention include compounds having at least one maleimide functional group substituted with a linear, branched or cyclic C1–C10 alkyl radical at the nitrogen atom. Exemplary alkyl maleimide compounds can have the formula below:

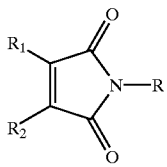

wherein:

each $R_1$ and $R_2$ is independently selected from the group consisting of hydrogen, C1 to C10 alkyl, cycloalkyl, aryl, alkoxy, and halogen, or $R_1$ and $R_2$ together form a fused saturated or unsaturated five or six membered cyclic hydrocarbon or heterocyclic ring system containing one or two O, N or S atoms, optionally substituted with alkyl, aryl, halogen, arylalkyl, alkylaryl, cycloalkyl, alkoxy, heteroatoms, silicon, and the like; and R is straight chain, branched or cyclic C1–C10 alkyl, optionally substituted with one or more C1–C4 alkyl, and preferably is C1–C4 alkyl or C6 cycloalkyl.

Exemplary alkyl maleimides include without limitation methyl maleimide, hexyl maleimide, cyclohexyl maleimide, and the like. Such compounds are known in the art and can be prepared using techniques known in the art. See, for example, Z. Y. Wang, Synthetic Comm. 20(11) 1607–1610 (1990); P. O. Tawney et al., J. Org. Chem. 26, 15 (1961); and U.S. Pat. No. 2,542,145.

Aliphatic maleimide compounds useful in the invention include compounds having at least one maleimide unit substituted with a functionalized aliphatic substituent at the nitrogen atom. The aliphatic substituent preferably is a linear or branched C1 to C10 alkyl, and more preferably methyl or ethyl. The alkyl is optionally substituted with C1 to C4 alkyl, C1 to C4 alkoxy, halogen, and the like as described below.

Aliphatic maleimides useful in the invention can be monofunctional (have one maleimide functional group), or can be di- or multi-functional (have two or more maleimide functional groups). For example, two or more aliphatic maleimide units can be connected or coupled via a spacer group(s), such as, but not limited to, linear or branched C1 to C10 alkyl, C3 to C6 cycloalkyl optionally substituted with C1 to C4 alkyl, C1 to C10 oxyalkyl, which can include one or more oxygen atoms, such as that derived from ethylene glycol, carbonate, aryl, alkylaryl, arylalkyl, and the like. Still further, maleimide compounds useful in the invention include maleimide units connected to polymeric or oligomeric compounds (typically having a molecular weight of at least about 1000). For example, unsaturated polyester resins with varying percent maleimide functionality incorporated therein as known in the art can be used.

Exemplary aliphatic maleimide compounds can have the formula below:

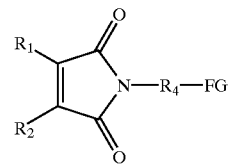

wherein:

(a) each $R_1$ and $R_2$ is independently selected from the group consisting of hydrogen, C1 to C10 alkyl, cycloalkyl, aryl, alkoxy, and halogen, or $R_1$ and $R_2$ together form a fused saturated or unsaturated five or six membered cyclic hydrocarbon or i heterocyclic ring system containing one or two O, N or S atoms, optionally substituted with alkyl, aryl, halogen, arylalkyl, alkylaryl, cycloalkyl, alkoxy, heteroatoms, silicon, and the like;

(b) $R_4$ is linear or branched C1 to C10 alkyl, heteroatom, or silicon —$SiH_2$—; and (c1) when $R_4$ is C1 to C10 alkyl, FG is a functional group selected from the group consisting of —$OR_3$, —$SR_3$, —$SiH_2R_3$, —$OC(O)N(R_3)_2$, —$OC(O)C(=CHR_3)R_3$, —$OC(O)R_3$, —$C(O)R_3$, —$N(R_3)_2$, —$C(O)OR_3$, —NCO, —$C(O)N(R_3)_2$, —$OC(O)OR_3$, —CN, halogen, —$CH_2$N-aryl-FG', —$CH_2$N-aryl-$R_3$—FG', sulfonic acid, quaternary ammonium, and salts thereof, in which each $R_3$ is selected from the group consisting of hydrogen, alkyl, aryl, cycloalkyl, arylalkyl, and alkylaryl, and in which FG' is selected from the group consisting of —$OR_3$, —$SR_3$, —$SiH_2R_3$, —$OC(O)N(R_3)_2$, —$OC(O)C(=CHR_3)R_3$, —$OC(O)R_3$, —$C(O)R_3$, —$N(R_3)_2$, —$C(O)OR_3$, —NCO, —$C(O)N(R_3)_2$, —$OC(O)OR_3$, —CN, halogen, sulfonic acid, and quaternary ammonium, or (c2) when $R_4$ is a heteroatom or silicon —$SiH_2$—, FG is selected from the group consisting of hydrogen, alkyl, aryl, cycloalkyl, alkylaryl, arylalkyl, alkyl-FG", and aryl-FG", wherein FG" is the same as FG' as defined in (c1) above, or (c3) FG is a functional group as defined in (c1) in combination with a spacer group linking said maleimide unit with at least one other maleimide unit to form a di- or multifunctional maleimide compound. Exemplary spacer groups include without limitation linear or branched C1 to C10 alkyl, C3 to C6 cycloalkyl, optionally substituted with lower C1 to C4 alkyl, C1 to C10 oxyalkyl, which can include one or more oxygen atoms, such as that derived from ethylene glycol, carbonate, and the like. Aliphatic maleimides useful in the invention are described, for example, in pending U.S. application Ser. No. 08/917,024, filed Aug. 22, 1997, titled "Polymerization Processes Using Aliphatic Maleimides," and its corresponding published international application PCT Publication No. WO 98/07759, the entire disclosure of each of which is hereby incorporated by reference.

Exemplary aliphatic maleimides useful in the invention include, but are not limited to:

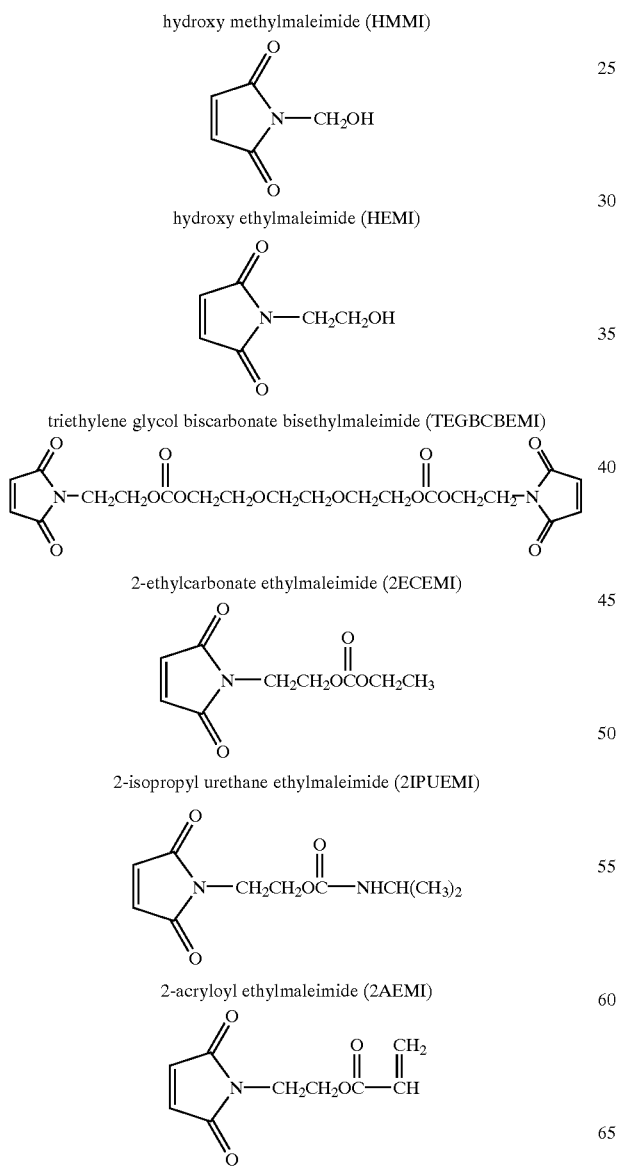

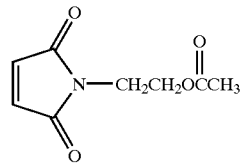

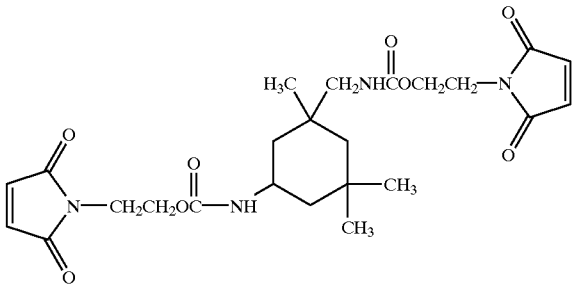

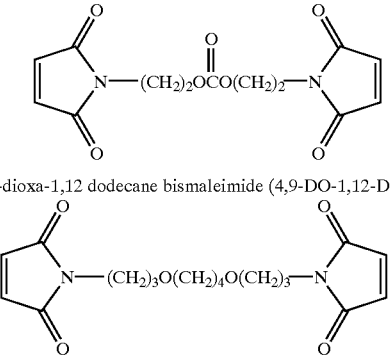

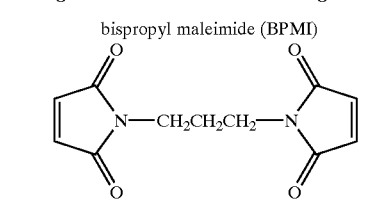

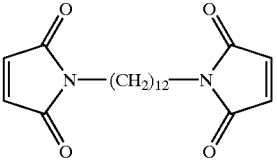

and the like.

Generally, aliphatic maleimides which include at least one maleimide unit as described above can be prepared using techniques known in the art. See, for example, Z. Y. Wang, Synthetic Comm. 20(11) 1607–1610 (1990); P. O. Tawney et al., J. Org. Chem. 26, 15 (1961); and U.S. Pat. No. 2,542,145.

Aromatic maleimides useful in invention include compounds according to formula below:

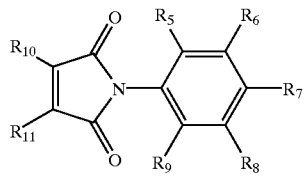

wherein:
each of $R_5$, $R_6$, $R_7$, $R_8$, and $R_9$ is independently selected from the group consisting of H, $CX_3$, $COOR_{12}$, $COR_{12}$, $OR_{12}$, CN, $SR_{12}$, $N(R_{12})_2$, $R_{13}$, X, and MI;

$R_{10}$ and $R_{11}$ each is independently selected from the group consisting of H, C1 to C10 alkyl, preferably C1–C4 alkyl, more preferably $CH_3$, cycloalkyl, aryl, alkoxy, and halogen, preferably chloride, or $R_1$ and $R_2$ together form a fused saturated or unsaturated five or six membered cyclic hydrocarbon or heterocyclic ring system containing one or two O, N or S atoms, optionally substituted with alkyl, aryl, halogen, arylalkyl, alkylaryl, cycloalkyl, alkoxy, heteroatoms, silicon, and the like;

X is halide, preferably F, Cl, Br, or I;

$R_{12}$ is selected from the group consisting of H, lower alkyl, cycloalkyl, and aryl;

$R_{13}$ is selected from the group consisting of lower alkyl, cycloalkyl, and aryl, or $R_{13}$ is a spacer group connecting at least two compounds of the above formula to form a di- or multi-functional maleimide; and MI is

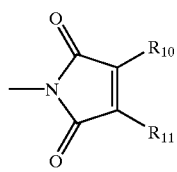

wherein $R_{10}$ and $R_{11}$ are as defined above. For example, two or more aromatic maleimide units can be connected or coupled via a spacer group(s), such as, but not limited to, linear or branched C1 to C10 alkyl, C3 to C6 cycloalkyl optionally substituted with C1 to C4 alkyl, C1 to C10 oxyalkyl, which can include one or more oxygen atoms, such as that derived from ethylene glycol, carbonate, aryl, alkylaryl, arylalkyl, and the like. The spacer group can be, for example:

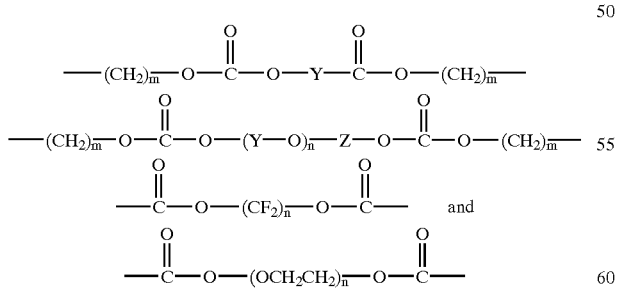

wherein Y and Z are each independently selected from C2 to C10 alkylene, m is an integer from 1 to 10, and n is an integer from 1 to 10;

Exemplary aromatic maleimides useful in the invention include, but are not limited to:

phenyl maleimide (PMI)

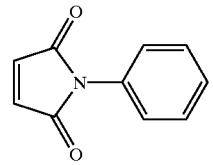

N-(2-$CF_3$-phenyl)maleimide (2CF3PMI)

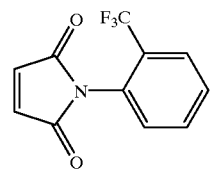

N-(2-t-butylphenyl)maleimide (NtBPMI)

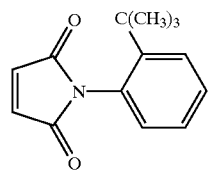

N-(2-$CF_3$-phenyl)methylmaleimide (2CF3PCI)

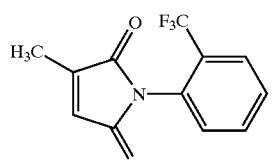

N-(2,4,6-isopropyl-3-maloimide phenyl)maleimide

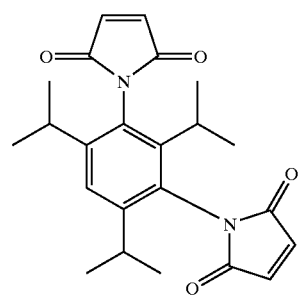

N-(2-iodophenyl) maleimide

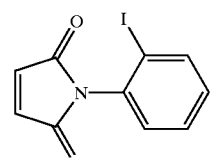

N-(2-bromo-3,5-$CF_3$-phenyl) maleimide

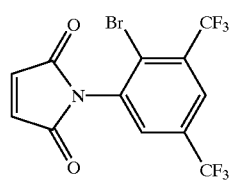

-continued
di(4-maleimidophenyl)methane

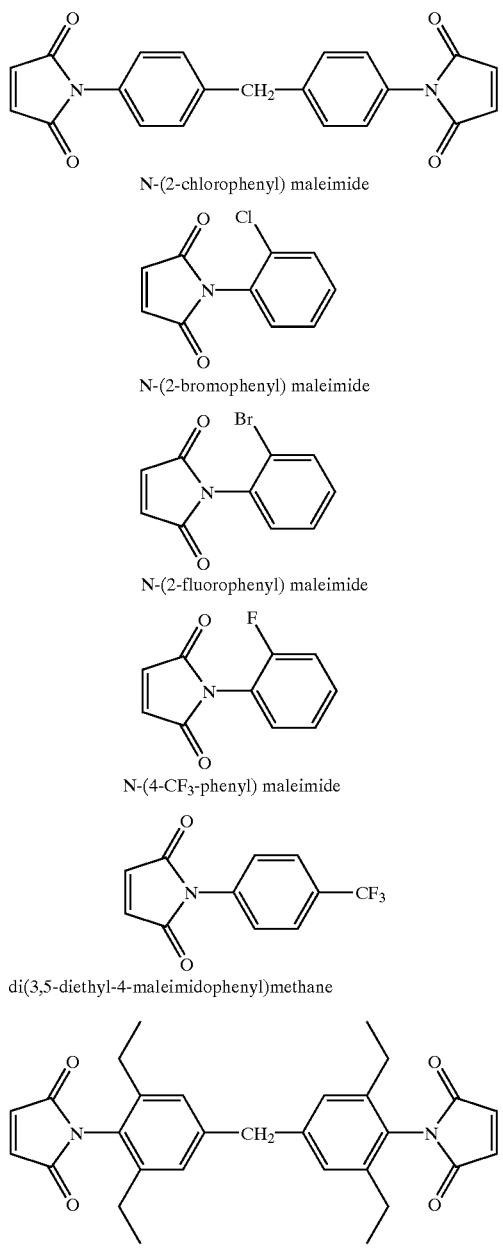

N-(2-chlorophenyl) maleimide

N-(2-bromophenyl) maleimide

N-(2-fluorophenyl) maleimide

N-(4-CF$_3$-phenyl) maleimide di(3,5-diethyl-4-maleimidophenyl)methane and the like.

Generally, aromatic maleimides can be prepared using techniques known in the art, with slight modifications as noted herein. The compounds, for example, can be synthesized using a two step method, which begins with the reaction of a suitably substituted aromatic amine with maleic anhydride (or a substituted maleic anhydride, such as citraconic anhydride) in a polar solvent, such as diethylether, to produce the amic acid in near quantitative yields. The amic acid is then recovered from the solvent and residual solvent and water can be removed from the recovered product.

The second step is acid catalyzed ring closure to form the imide. This reaction is performed by dissolving the amic acid in a suitable solvent, such as an organic hydrocarbon solvent such as toluene, optionally with a small amount of cosolvent, such as dimethylsulfoxide (DMSO), adding a catalytic amount of concentrated sulfuric acid, heating the mixture, preferably to reflux, and removing water through the water/solvent azeotrope. Excess solvent can then be removed, and the residual concentrated solution of the imide in solvent precipitated. The imide is then collected and dried to remove water and residual solvent(s). The second step can also give near quantitative yields. Aromatic maleimides useful in the invention are described, for example, in pending provisional application Serial No. 60/047,729, filed May 27, 1997, titled "Aromatic Maleimides," and its corresponding published international application PCT Publication No. WO 98/54134, the entire disclosure of each of which is hereby incorporated by reference.

As used herein, the term alkyl refers to linear or branched C1 to C10 alkyl, such as but not limited to methyl, ethyl, propyl, butyl, isopropyl, and the like, optionally substituted with halogen, aryl, arylalkyl, alkylaryl, cycloalkyl, alkoxy, heteroatoms, silicon, and the like. The term alkoxy refers to linear or branched C1 to C10 alkoxy. The term cycloalkyl refers to C3 to C6 cycloalkyl, such as but not limited to cyclopentyl and cyclohexyl, also optionally substituted with halogen, aryl, alkyl, arylalkyl, alkylaryl, alkoxy, heteroatoms, silicon and the like. The term aryl refers to C3 to C10 cyclic aromatic groups such as but not limited to phenyl, naphthyl, and the like, optionally substituted with halogen, alkyl, arylalkyl, alkylaryl, cycloalkyl, alkoxy, heteroatoms, silicon, and the like. The term heteroatom refers to oxygen, sulfur, and nitrogen.

The photopolymerizable compositions include at least one maleimide as defined above as a component thereof, for example, as a photoinitiator, a comonomer, and the like. As used herein; and as will be appreciated by the skilled artisan, the term photopolymerizable composition refers to compositions which harden or cure upon exposure to radiation.

Generally the compositions of the invention include ethylenically unsaturated compounds, including monomers and oligomers derived from acrylic and methacrylic acid, optionally dispersed or dissolved in a suitable solvent that is copolymerizable therewith, and mixtures thereof, which are photopolymerizable when exposed to a source of radiation (ultraviolet or UV radiation, or radiation outside the UV spectrum), particularly free radical polymerizable systems. As will be appreciated by the skilled artisan, the photopolymerizable compounds can be monofunctional, or can include two or more polymerizable ethylenically unsaturated groupings per molecule.

Exemplary photopolymerizable compounds or precursors include, but are not limited to, reactive vinyl monomers, including acrylic monomers, such as acrylic and methacrylic acids, and their amides, esters, salts and corresponding nitriles. Suitable vinyl monomers include, but are not limited to, methyl acrylate, ethyl acrylate, n- or tert-butylacrylate, isooctyl acrylate, methyl methacrylate, ethylmethacrylate, 2-ethylhexyl methacrylate, butylacrylate, isobutyl methacrylate, the corresponding hydroxy acrylates, i.e., hydroxy ethylacrylate, hydroxy propylacrylate, hydroxy ethylhexyl methacrylate, glycol acrylates, i.e., ethylene glycol dimethacrylate, hexamethylene glycol dimethacrylate, the allyl acrylates, i.e., allyl methacrylate, diallyl methacrylate, the epoxy acrylates, i.e., glycidyl methacrylate, and the aminoplast acrylates, i.e., melamine acrylate. Others such as vinyl acetate, vinyl and vinylidene halides and amides, i.e., methacrylamide, acrylamide, diacetone acrylamide, vinyl and vinylidene esters, vinyl and vinylidene ethers, vinyl and vinylidene ketones, butadiene, vinyl aromatics, i.e., styrene, alkyl styrenes, halostyrenes, alkoxystyrenes, divinyl benzenes, vinyl toluene, and the like are also included. Prepolymers include acrylated epoxides, polyesters and polyurethanes, and are typically combined with a suitable monomer for viscosity control.

The photopolymerizable compounds may be polymerized to form homopolymers or copolymerized with various other monomers.

The photopolymerizable compound can be present in the compositions of the invention in amounts from about 0 to about 99.8, preferably about 80 to about 99.8, percent by weight, based on the total weight of the composition.

The maleimides can be used singly or as mixtures thereof, and are useful as photopolymerization initiators. In this aspect of the invention, the maleimide compounds can be present in the photopolymerizable composition in an amount sufficient to initiate polymerization thereof upon exposure to radiation. The composition can include about 0.01 to about 100, preferably about 0.01 to about 20, more preferably about 0.01 to about 10, percent by weight maleimide compound, based on the total weight of the photopolymerizable compounds. The inventors have found that only relatively low concentrations of the maleimide are required for desirable results. For example, the maleimide can be present in amounts of about 0.01 mole percent to about 2 mole percent, and even less than about 0.1 mole percent.

The benzophenone compound can be benzophenone or any derivative thereof, including thioxanthone and derivatives thereof, and mixtures of such compounds, having photoactive activity. Such compounds are known in the art and include compounds of the following structure:

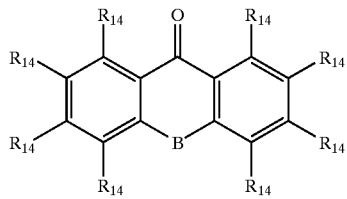

wherein:

B is (H,H), —CH$_2$—, —S—, —O—, —CO—, —NR$_{15}$—, or a bond bridging the two aromatic rings;

each R$_{14}$ is independently selected from the group consisting of hydrogen, alkyl, cycloalkyl, alkoxy, aryl, alkylaryl, arylalkyl, halogen, trihaloalkyl, —CN, —NO$_2$, —C(O)OR$_{15}$, —C(O)R$_{15}$, —OR$_{15}$, —N(R$_{15}$)$_2$, —OC(O)CR$_{15}$=CHR$_{15}$, R$_{16}$, —OR$_{16}$, —R$_{17}$—OC(O)CR$_{15}$=CHR$_{15}$, polymerizable moieties, and oligomeric and polymeric moieties;

R$_{15}$ is selected from the group consisting of hydrogen, alkyl, aryl, cycloalkyl, arylalkyl, and alkylaryl;

R$_{16}$ is one or more saturated or unsaturated five or six membered hydrocarbon or heterocyclic ring system, optionally substituted with one or more alkyl, cycloalkyl, or halogen; and R$_{17}$ is selected from the group consisting of alkyl, aryl, cycloalkyl, arylalkyl, and alkylaryl.

The term polymerizable moiety refers to ethylenically unsaturated moieties known in the art which are capable of reaction with another compound (for example, by a free radical mechanism), such as but not limited to, acrylate and methacrylate moieties. For example, R$_{14}$ can have the structure —(CH$_2$)$_n$—OC(O)—CRH=CH$_2$ wherein n is an integer from 1 to 10 and R is H or lower alkyl. Another exemplary polymerizable entity is a maleimide moiety as described above.

The terms oligomeric and polymeric moieties refer to a moiety including two or more monomer units (dimer, trimer, etc.), typically having a molecular weight of at least about 500, and higher. Thus the benzophenone compound can be an oligomer or polymer having one or more benzophenone functionalities incorporated therein (along the backbone and/or side chain). Exemplary oligomeric and polymeric moieties include but are not limited to a C2–C20 alkylene or polyalkylene polyol, wherein hydroxy groups of the polyol moiety are optionally alkylated, and preferably an alkylene or polyalkylene polyol derived from ethylene glycol. Other suitable oligomer or polymer moieties include C2–C20 alkylene or polyalkylene moieties end capped with trihaloalkyl, and optionally substituted with one or more halogen atoms along the chain, preferably fluorine. Other exemplary oligomeric or polymer moieties include C2–C20 alkylene or polyalkylene moieties including carbonate groups and end capped with lower alkyl. Other exemplary oligomeric or polymeric moieties include polyether ketones and polyacrylate and polymethacrylate based compounds. Such oligomeric and polymeric benzophenones are known in the art and are commercially available.

Exemplary benzophenone compounds useful in the invention include without limitation benzophenone, thioxanthone, isopropylthioxanthone, chlorothioxanthone, methyl o-benzoylbenzoate, 4-morpholinobenzophenone, 4,4'-diphenoxybenzophenone, 1-methyl-2-(2-ethylhexyloxy) thioxanthone, 4,4'-di-(4-isopropylphenoxy)benzophenone, acrylic acid 4-benzoylphenyl ester, 4,4'-diphenylbenzophenone, 4-phenylbenzophenone, and the like, as well as mixtures thereof. These and other benzophenone compounds are in known in the art and are commercially available or can be produced using commercially available starting materials. The benzophenone photoinitiator can be present in an amount ranging from about 0.001 to about 5 percent by weight, based on the total weight of the composition.

The sensitizer package also includes at least one coinitiator or synergist, that is, a molecule which serves as a hydrogen atom donor or an electron donor. Coinitiators or synergists are known in the art, and are typically alcohols, tertiary amines or ethers which have available hydrogens attached to a carbon adjacent to a heteroatom. The hydrogen atom donor can be present as a separate compound or can be included as a molecular component of the photopolymerizable compound (for example, polyethylene glycol diacrylate). Such coinitiators when a separate component are typically present in an amount between about 0.1 and about 5 percent by weight based on the total weight of the composition. When present as a molecular component of a photopolymerizable compound, the hydrogen atom donor component can be up to about 85 weight percent, and higher, of the photopolymerizable compound. Suitable compounds include, but are not limited to, triethanolamine, methyldiethanolamine, ethyldiethanolamine and esters of dimethylamino benzoic acid. Other known coinitiators or accelerators can also be used.

The photopolymerizable compositions of the invention may also contain other conventional agents, such as polymerization inhibitors, fillers, ultraviolet absorbers, organic peroxides, dyes, pigments, and the like.

The photopolymerizable compositions can be applied or deposited on a surface of a substrate using conventional techniques and apparatus. The composition can be applied as a substantially continuous film. Alternatively, the composition can be applied in a discontinuous pattern. The thickness of the deposited composition can vary, depending upon the desired thickness of the resultant cured product.

Typically, the substrate is coated with the uncured photopolymerizable composition and passed under a commercially available UV or excimer lamp on a conveyer moving at predetermined speeds. The substrate to be coated can be, for example, metal, wood, mineral, glass, paper, plastic, fabric, ceramic, and the like.

The active energy beams used in accordance with the present invention may be visible light or ultraviolet light or may contain in their spectra both visible and ultraviolet light. The polymerization may be activated by irradiating the composition with ultraviolet light using any of the techniques known in the art for providing ultraviolet radiation, i.e., in the range of 200 nm and 450 nm ultraviolet radiation, and especially with the 308 nm emission from xenon chloride exciter lamps, commercially available from Fusion Systems, or by irradiating the composition with radiation outside of the ultraviolet spectrum. The radiation may be natural or artificial, monochromatic or polychromatic, incoherent or coherent and should be sufficiently intense to activate the photoinitiators of the invention and thus the polymerization. Conventional radiation sources include fluorescent lamps, excimer lamps, mercury, metal additive and arc lamps. Coherent light sources include pulsed nitrogen, xenon, argon ion- and ionized neon lasers whose emissions fall within or overlap the ultraviolet or visible absorption bands of the compounds of the invention.

The compositions are useful in any of the types of applications known in the art for photopolymerizations, including as a binder for solids to yield a cured product in the nature of a paint, varnish, enamel, lacquer, stain or ink. The compositions can also be useful in the production of photopolymerizable surface coatings in printing processes, such as lithographic printing, screen printing, and the like. The compositions can also be useful in applications in which the compositions are applied to articles which are to be exposed to the environment, such as signage. Radiation cured coatings produced using conventional photoinitiators typically degrade over time (as evidenced by yellowing, increasing brittleness, and the like), which degradation is exacerbated by direct exposure to sunlight. In contrast, radiation cured coatings prepared using the maleimide compounds can exhibit minimal degradation over time, even when exposed to direct sunlight. The maleimides can also be water soluble.

The present invention will be further illustrated by the following non-limiting examples.

EXAMPLE 1

Synthesis of Hydroxy Methylmaleimide (HMMI)

Maleimide (10 g, 0.103 mol) was added to 10 mL of a 37% solution of formaldehyde and 0.31 mL of a 5% solution of NaOH was added. Within 10 minutes all of the maleimide had dissolved and an exothermic reaction proceeded. The solution was stirred for 2 hours where white crystals were observed. The solution was placed in a freezer overnight and the resulting crystals filtered and washed with ice cold ethanol and diethyl ether. The white crystals were purified twice by sublimation. See P. O. Tawney, R. H. Snyder, R. P. Conger, K. A. Leibbrand, C. H. Stiteler, and A. R. Williams J. Org. Chem. 26, 15 (1961).m.p. 104–106° C. (9.77 g, 74.6%). $^1$H-NMR (Acetone-$d_6$, δ, ppm): 4.96 (2H, —CH$_2$—, s), 5.33 (1H, —OH, s), 6.93 (2H, —CH=CH—, s). $^{13}$C-NMR (Acetone-$d_6$, δ, ppm): 60.9 (1C, —CH$_2$—), 135.6 (2C, —CH=CH—), 173.1 (1C, —C=O).

EXAMPLE 2

Synthesis of Hydroxy Ethylmaleimide (HEMI)

Ethanolamine (80.96 g, 1.32 mol) was added to 500 mL of ethanol and cooled to 0° C. using an ice bath. 3,6-Endoxo-1,2,3,6-tetrahydrophthalic anhydride (220.21 g, 1.32 mol) was added to the solution and allowed to stir overnight. The yellow tinted crystals were used without purification. The solution was refluxed for four hours with azeotropic removal of water. The solution was cooled to 0° C. and the resulting crystals filtered (151.74 g, 54.95%). Removal of furan was facilitated by refluxing the crystals in xylenes for 4 hours with quantitative yield of hydroxy ethylmaleimide after purification by sublimation to yield white crystals, —CH$_2$O—), 134.2 (2C, —CH=CH—), 171.2 (2C, —NC=O m.p. 68° C. $^1$H-NMR (CDCl$_3$, δ, ppm): 2.62 (1H, —OH, s), 3.82–3.77 (4H, —NCH$_2$CH$_2$O—, overlapping), 6.76 (2H, —CH=CH—, s). $^{13}$C-NMR (CDCl$_3$, δ, ppm): 40.5 (1C, —NCH$_2$—), 60.5 (1C,).

EXAMPLE 3

Triethylene Glycol Biscarbonate Bisethylmaleimide (TEGBCBEMI)

HEMI (25.65 g, 0.182 moles) and pyridine (14.38 g, 0.182 moles) were dissolved in THF (130 mL) and the solution was stirred at room temperature. Triethylene glycol bischloroformate (25.0 g, 0.091 moles) was added dropwise and stirred for 90 minutes. The pyridine salt was filtered off and the solution was combined with 200 mL of a 1N HCl solution. The product was extracted with methylene chloride and washed with a 1N HCl solution followed by water and then dried over magnesium sulfate. The red solution was diluted to a volume of 150 mL and purified by column chromatography (2.5 cm×21 cm) using silica gel as the packing and methylene chloride as the mobile phase yielding white crystals, m.p. 65° C. (26.75 g, 60.76%). $^1$H-NMR (CDCl$_3$), δ, ppm): 3.64–3.68 (4H φ-OCH$_2$—, t), 3.69–3.74 (4H, ε-OCH$_2$—, t), 3.81–3.86 (4H, —NCH$_2$—, t), 4.26–4.3 (8H, —CH$_2$O(C=O)OCH$_2$—, t), 6.75 (4H, —CH=CH—, s). $^{13}$C-NMR (CDCl$_3$, δ, ppm): 36.6 (2C, —NCH$_2$—), 64.7 (2C), 67.3 (2C), 68.8 (2C), 70.6 (2C), 134.4 (4C, —CH=CH—), 154.8 (2C, O(C=O)O), 170.4 (4C, —NC=O).

EXAMPLE 4

Synthesis of 2-Ethylcarbonate Ethylmaleimide (2ECEMI)

Hydroxy ethylmaleimide (29.87 g, 0.212 moles) and pyridine (16.7 g, 0.212 moles) were dissolved in THF (170 mL) and the solution was stirred at room temperature. Ethyl chloroformate (22.97 g, 0.212 moles) was added dropwise and stirred for 90 minutes. The pyridine salt was filtered off and the solution was combined with 200 mL of a 1N HCl solution. The product was extracted with methylene chloride and washed with a 1N HCl solution followed by water and then dried over magnesium sulfate. The red solution was concentrated and the red crystals purified by sublimation yielding white crystals, m.p. 52° C. (34.76 g, 77.04%). $^1$H-NMR (CDCl$_3$), δ, ppm): 1.26–1.34 (3H, —CH$_3$, t), 3.81–3.87 (2H—NCH$_2$—, t), 4.14–4.25 (2H, δ-CH$_2$OC=O, q), 4.25–4.30 (2H, β-CH$_2$O—, t), 6.74 (2H, —CH=CH—, s). $^{13}$C-NMR (CDCl$_3$, δ, ppm): 14.2 (1C, —CH$_3$), 36.8 (1C, —NCH$_2$—), 64.3 (1C, δ-CH$_2$O), 64.5 (1C, β-CH$_2$—), 134.4 (2C, —CH=CH—), 154.9 (1C, O(C=O)O), 170.4 (2C, —C=O).

EXAMPLE 5

Synthesis of 2-Isopropyl Urethane Ethylmaleimide (2IPUEM)

Hydroxy ethylmaleimide (5 g, 35.4 mmol) was dissolved in 75 mL of methylene chloride 1 drop of dibutyl tin dilaurate catalyst was added. Isopropyl isocyanate (3.01 g, 35.4 mmol) was added dropwise and the solution was stirred for 3 hours. The solution was washed with water dried with magnesium sulfate. Concentration yielded white crystals which were further purified sublimation yielding white crystals, m.p. 117° C. (6.49 g, 81%). $^1$H-NMR (CDCl$_3$, δ, ppm): 1.11–1.14 (6H, —C(CH$_3$)$_2$, d), 3.74–3.79 (2H, —NCH$_2$—, t), 4.28–4.32 (2H, —CH$_2$—, t), 4.44–4.53 (1H, —CH—, p), 6.72 (2H, —OC—CH=CH—CO—, s). NMR $^{13}$C-NMR (CDCl$_3$, δ, ppm): 170.5 (2C, C=O, maleimide), 155.1 (1C, C=O, urethane), 134.2 (2C, —CH=CH—), 61.7 (1C, β-CH$_2$), 43.6 (1C, —CH—), 37.4 (1C, α-CH$_2$), 22.9 (2C, —CH$_3$).

EXAMPLE 6

Synthesis of 2-Acryloyl Ethylmaleimide (2AEMI)

2-Hydroxyethyl maleimide (5 g, 35.4 mmol) and Et$_3$N (4.25 g, 43.0 mmol) was dissolved in 75 mL of methylene chloride and cooled to 0° C. Acryloyl chloride (3.20 g, 35.4 mmol) in 25 mL of methylene chloride was added dropwise over 30 minutes. The solution was stirred at room temperature for 30 minutes followed by refluxing for 1 hour. The triethylamine hydrochloride was removed by filtration and the yellow solution was concentrated. The yellow crystals were purified by sublimation yielding white crystals, m.p. 77–78° C. (5.00 g, 72.3%). $^1$H-NMR (CDCl$_3$, δ, ppm): 3.81–3.87 (2H, —NCH$_2$—, t) 4.22–4.33 (2H, —OCH$_2$—, t), 5.81–5.85 (2H, CH$_2$=CH, cis), 6.00–6.13 (1H, CH$_2$=CH—, q), 6.34–6.42 (1H CH$_2$=CH, trans), 6.73 (2H, —OC—CH=CH—CO—, s). $^{13}$C-NMR (CDCl$_3$, δ, ppm): 170.4 (2C, C=O, maleimide), 165.8 (1C, C=O, ester), 134.2 (2C, —CH=CH—), 131.45 (1C, —CH=), 127.9 (1C, CH$_2$=), 61.5 (1C, β-CH$_2$—), 36.8 (1C, α-CH$_2$—).

EXAMPLE 7

Synthesis of Acetoxy Ethyl Maleimide (AcOEMI)

Maleic anhydride (172.32 g, 1.75 mol) was added to ethanolamine (107.34 g, 1.75 mol) and dissolved in 500 mL of acetone while stirring overnight in an ice bath. To the solution, 400 mL of acetic anhydride (4.23 mol) was added with sodium acetate (144 g, 1.75 mol). The solution was heated to 80° C. and stirred for 1 hour. The contents were poured into ice water and the acetic acid neutralized with K$_2$CO$_3$. The product was extracted with methylene chloride and then dried using magnesium sulfate. The product was purified by sublimation yielding white crystals, m.p. 76° C. (44.1 g, 13.45%). $^1$H-NMR (CDCl$_3$, δ, ppm): 2.02 (3H, —CH$_3$, s), 3.82–3.77 (2H, —NCH$_2$—, t), 4.25–4.20 (2H, —CH$_2$O—, t), 6.75 (2H, —CH=CH—, s). $^{13}$C-NMR (CDCl$_3$, δ, ppm): 20.7 (1C, —CH3), 37.0 (1C, —NCH$_2$—), 61.5 (1C, —CH$_2$O—), 134.3 (2C, —CH=CH—), 170.5 (2C, —NC=O), 170.8 (1C, —OC=O).

EXAMPLE 8

Synthesis of 4,9-Dioxa-1,12 Dodecane Bismaleimide (4,9-DO-1,12-DDBMI)

4,9-Dioxa-1,12-dodecane diamine (25 g, 0.122 mol) was dissolved in acetone and added dropwise to a solution of maleic anhydride (24 g 0.244 mol) in 120 mL of acetone under cooling using an ice bath in a nitrogen atmosphere. The solution was stirred overnight and the contents were then poured into water and the bismaleamic acid filtered and washed with ethanol and diethylether.

The bismaleamic acid (29.96 g, 74.8 mmol) was dissolved in an acetone 120 mL and triethylamine (41.7 mL, 0.300 mol) solution. The solution was heated to reflux, where acetic anhydride (21.2 mL, 0.224 mol) was added dropwise, the solution was refluxed for 12 hours. The solution was added to ice water and the precipitate filtered and dried. The sample was purified by column chromatography using silica gel as the adsorbent and methylene chloride as the mobile phase yielding white crystals, m.p. 65° C. (5.5 g, 20.2%). $^1$H-NMR (CDCl$_3$, δ, ppm): 1.60–1.54 (2H, ε-CH$_2$—), 1.91–1.78 (2H, β-CH$_2$—), 3.44–3.28 (4H, —CH$_2$OCH$_2$—), 3.66–3.59 (2H, —NCH$_2$—, t), 6.70 (2H, —CH=CH—, s). $^{13}$C-NMR (CDCl$_3$, δ, ppm): 26.4 (2C, ε-CH$_2$—), 28.6 (2C, β-CH$_2$—), 35.6 (2C, —NCH$_2$—), 68.2, 70.7 (4C, —CH$_2$OCH$_2$—), 134.2 (2C, —CH=CH—), 170.8 (2C, —NC=O).

EXAMPLE 9

Synthesis of Isophorone bisurethane bisethylmaleimide (IPBUBEMI)

Hydroxy ethylmaleimide (10 g, 0.141 mol) was dissolved in acetone and purged with nitrogen while stirring in an ice bath. One drop of dibutyl tin dilaurate was added to the solution. The isophorone diisocyanate (30.5 g, 0.141 mol) was added dropwise over 2–3 hours. The solution was allowed to stir overnight and a white precipitate was obtained after solvent removal m.p. 105–112° C. (40.5 g, 100%). $^1$H-NMR (D$_6$-DMSO, δ, ppm): 3.63–3.58 (2H, —NCH$_2$—), 4.08–4.03 (2H, —CH$_2$O—, t), 7.03 (2H, —CH=CH—, s). $^{13}$C-NMR (D$_6$-DMSO, δ, ppm): 134.5 (2C, —CH=CH—), 154.9 (2C, NHC=O), (170.7 (2C, —NC=O).

EXAMPLE 10

Synthesis of Bispropyl Maleimide (PBMI)

Diaminopropane was dissolved in 100 mL of dimethyl acetamide (DMAC) and added dropwise to a solution of maleic anhydride in DMAC under cooling using an ice bath in a nitrogen atmosphere. The solution was stirred overnight and the contents were then poured into water and the bismaleamic acid filtered and washed with ethanol and diethylether.

The bismaleamic acid (84.54 g, 0.312 mol) was dissolved in 312 mL of an acetone and triethylamine (87 mL, 0.624 mol) solution. The solution was heated to reflux and acetic anhydride (88 mL, 0.61 mol) was added dropwise through a reflux condenser and the solution was refluxed for 12 hours. The solution was added to ice water and the precipitate filtered and dried. The sample was purified by column chromatography using silica gel as the adsorbent and methylene chloride as the mobile phase yielding white crystals, m.p. 166° C. (19.28 g, 26.3%). $^1$H-NMR (CDCl$_3$, δ, ppm): 2.00–1.86 (2H, —CH$_2$—, p), 3.57–3.50 (4H, —NCH$_2$—, t), 6.71 (2H, —CH=CH—, s). $^{13}$C-NMR (CDCl$_3$, δ, ppm): 27.3 (1C, —CH$_2$—), 35.3 (2C, —NCH$_2$—), 134.2 (2C, —CH=CH—), 170.6 (2C, —NC=O).

EXAMPLE 11

Synthesis of Bisethylmaleimide Carbonate (BEMIC)

Hydroxy ethylmaleimide (10.0 g, 70.1 mmol) was dissolved in a solution of methylene chloride (71 mL) and triethylamine (9.87 mL, 70.8 mmol) and cooled with an ice bath to 0° C. Triphosgene (3.504 g, 12 mmol) was added over a period of 4 hours and the resulting solution filtered. The supernatant was washed with 1N hydrochloric acid, 5% potassium carbonate solution and water. The solution was dried over magnesium sulfate and purified using activated carbon to yield white crystals (4.0 g, 18.5%). $^1$H-NMR (CDCl$_3$, δ, ppm): 3.82 (4H, —NCH$_2$—, t), 4.27 (2H, —CH$_2$O—, t), 6.73 (2H, —CH=CH—, s). $^{13}$C-NMR (CDCl$_3$, δ, ppm): 36.6 (2C, —NCH$_2$—), 64.9 (2C, —CH$_2$O—), 134.2 (2C, —CH=CH—), 154.5 (1C, C=O) 170.8 (2C, —NC=O).

EXAMPLE 12

Synthesis of N-(2-CF$_3$-phenyl)maleimide 32.5 g of maleic anhydride is placed in 700 mL diethylether and allowed to dissolve. 41.48 mL of 2-trifluoromethyl aniline is added squirtwise to the stirring solution. The reaction is allowed to proceed at room temperature overnight and a pale white precipitate is observed. The stirring solution is then warmed for several hours and filtered, yielding a pale white solid. The mother liquor is then combined with the wash liquor and allowed to stir again, and additional product is filtered off. The solids are then combined and dried in vacuum. Typical yields are 90–98%.

44.8 g of the maleamic acid is then placed in a three necked flask with 100 mL toluene and 25 mL DMSO, and allowed to dissolve. 1.8 mL of concentrated sulfuric acid is then added to the stirring mixture, which is then heated to about 130° C. The reaction mixture is allowed to reflux for 4 hours or until an azeotrope is no longer observed. Excess toluene is then removed via vacuum distillation. The mixture is then added to stirring distilled water to precipitate the imide and remove excess DMSO. The aqueous suspension is allowed to stir overnight and is then filtered. The pale white solid is then dried under vacuum to remove water, DMSO and toluene. Yields are typically 90–97%.

Products from both steps are analyzed using $^1$H and $^{13}$C NMR in d$_6$-DMSO. The maleamic acid is characterized by a broad peak due to the acid proton near 13–14 ppm, a peak due to the amide proton near 10 ppm, and two doublets due to the ene protons near 6.4 ppm in the proton spectra. The maleamic acid is also characterized by two peaks near 165 ppm due to the two carbonyls in the carbon spectrum. The maleimide is characterized by the absence of the acid and amide proton peaks, and the single ene proton peak shifted to near 7.6 ppm in the proton spectrum. In the carbon spectrum the maleimide shows a single carbonyl peak near 170 ppm.

The melting point of N-(2-CF$_3$-phenyl)maleimide is measured using DSC at a heating rate of 20° C./min and found to be 115.91 C. (endotherm peak maximum). Heat of fusion is also calculated to be 71.62 J/g.

EXAMPLE 13

Synthesis of N-(2-t-butylphenyl)maleimide

N-(2-t-butylphenyl)maleimide is also prepared as described in Example 12, except substituting 2-trifluoromethyl aniline with 2-tert-butyl aniline. The melting point of N-(2-t-butylphenyl)maleimide is measured using DSC at a heating rate of 20° C./min and is found to be 99.64 C. (endotherm peak maxima). Heat of fusion is also calculated to be 94.02 J/g.

EXAMPLE 14

Synthesis of N-(2-CF$_3$-phenyl)methylmaleimide

N-(2-CF$_3$-phenyl)methylmaleimide is also prepared as described in Example 12, except substituting citraconic anhydride for maleic anhydride.

EXAMPLE 15

Synthesis of N-(2-iodo-phenyl)maleimide

N-(2-iodo-phenyl)maleimide is prepared as described in Example 12, except substituting 2-trifluoromethyl aniline with 2-iodoaniline.

EXAMPLE 16

Synthesis of N-(2-bromo-3,5-CF$_3$-phenyl)maleimide

N-(2-bromo-3,5-CF$_3$-phenyl)maleimide is prepared as described in Example 12, except substituting 2-trifluoromethyl aniline with 2-bromo-3,5-trifluoromethyl aniline.

EXAMPLE 17

Photopolymerization Using Benzophenone/Amine/Maleimide Formulation

FIG. 1 is a graph illustrating photo-DSC exotherm rate results for the photopolymerization of a typical UV curable monomer (HDDA is 1,6-hexanediol diacrylate) with photoinitiator packages of benzophenone (BZPN)/1% methyl diethanol amine (NMDEA) and N-methyl maleimide (MMI)/1% NMDEA. For the results in FIG. 1, the concentrations were adjusted to give comparable initiator absorbances. The benzophenone/NMDEA system generates a higher exotherm peak rate and a shorter time is required to attain the peak maximum as compared to the MMI/NMDEA system.

Figure 2:
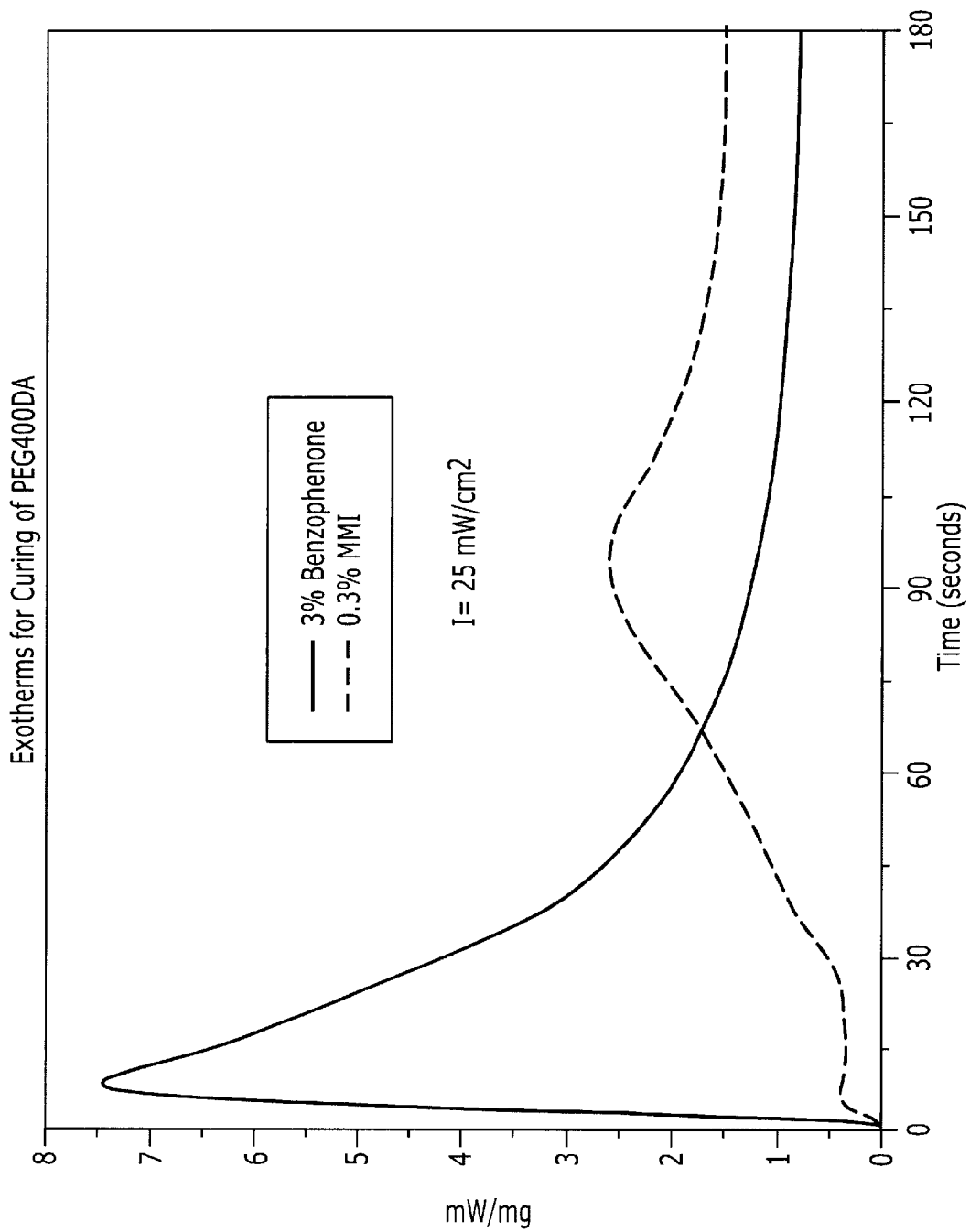
FIG. 2 is a graph illustrating photo-DSC exotherm rates for the photopolymerization of polyethylene glycol diacrylate (PEG 400 DA) with photoinitiator packages of 3% BZPN/1% NMDEA and 0.31% MMI/1% NMDEA.

Similar results are illustrated in FIG. 2 for the photopolymerization of polyethylene glycol (400) diacrylate (PEG 400 DA) which has abstractable hydrogens between the acrylate functionalities. While it is possible to achieve somewhat faster rates by using maleimides with groups that have abstractable hydrogens (such as heteroatom containing groups), the rates achieved are still quite small compared to conventional photoinitiator systems.

Figure 3:
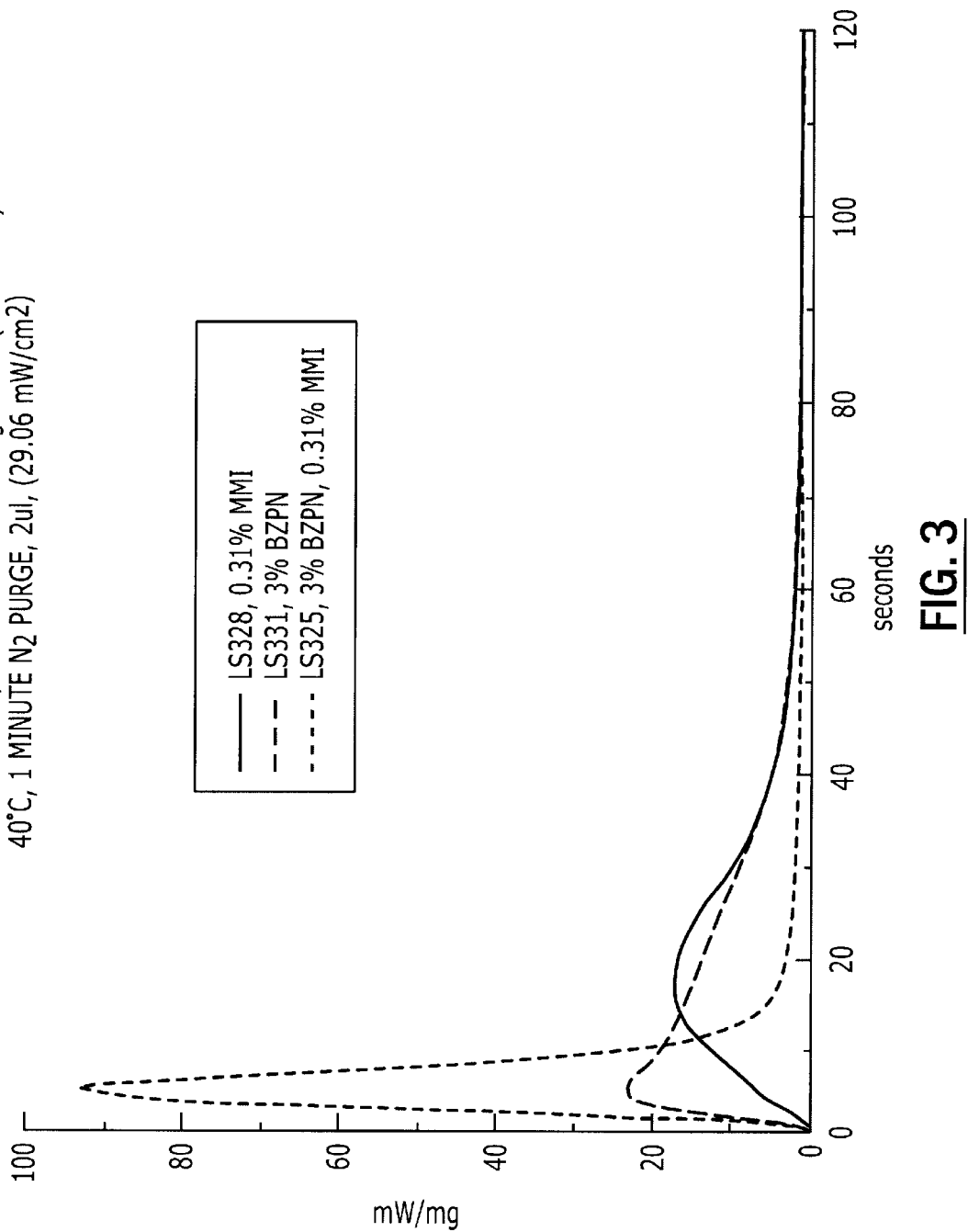
FIG. 3 is a graph illustrating photo-DSC exotherm rates for the photopolymerization of HDDA with photoinitiator packages of 3% BZPN/1% NMDEA, 0.31% MMI/1% NMDEA, and 3% BZPN/0.31% MMI/1% NMDEA.

FIG. 3 gives photo-DSC exotherm results in nitrogen saturated systems that incorporate three components (benzophenone sensitizer, methyl maleimide, and NMDEA) as the photoinitiator package for the polymerization of HDDA. The exotherm rate maximum increased dramatically when both methyl maleimide and benzophenone are present as compared to the exotherm rates for systems in which methyl maleimide/NMDEA are present or in which benzophenone/NMDEA are used and maleimide has been excluded. In other words, the synergistic effect on polymerization rate of having the N-alkyl maleimide present is dramatic, resulting in a substantially faster overall curing process under the conditions employed. The results in FIG. 3 were attained for systems in which the samples were exposed to the unfiltered 30 mW output of a medium pressure mercury lamp similar in spectral output (but lower in overall intensity) to the lamps used in the UV curing industry.

Figure 4:
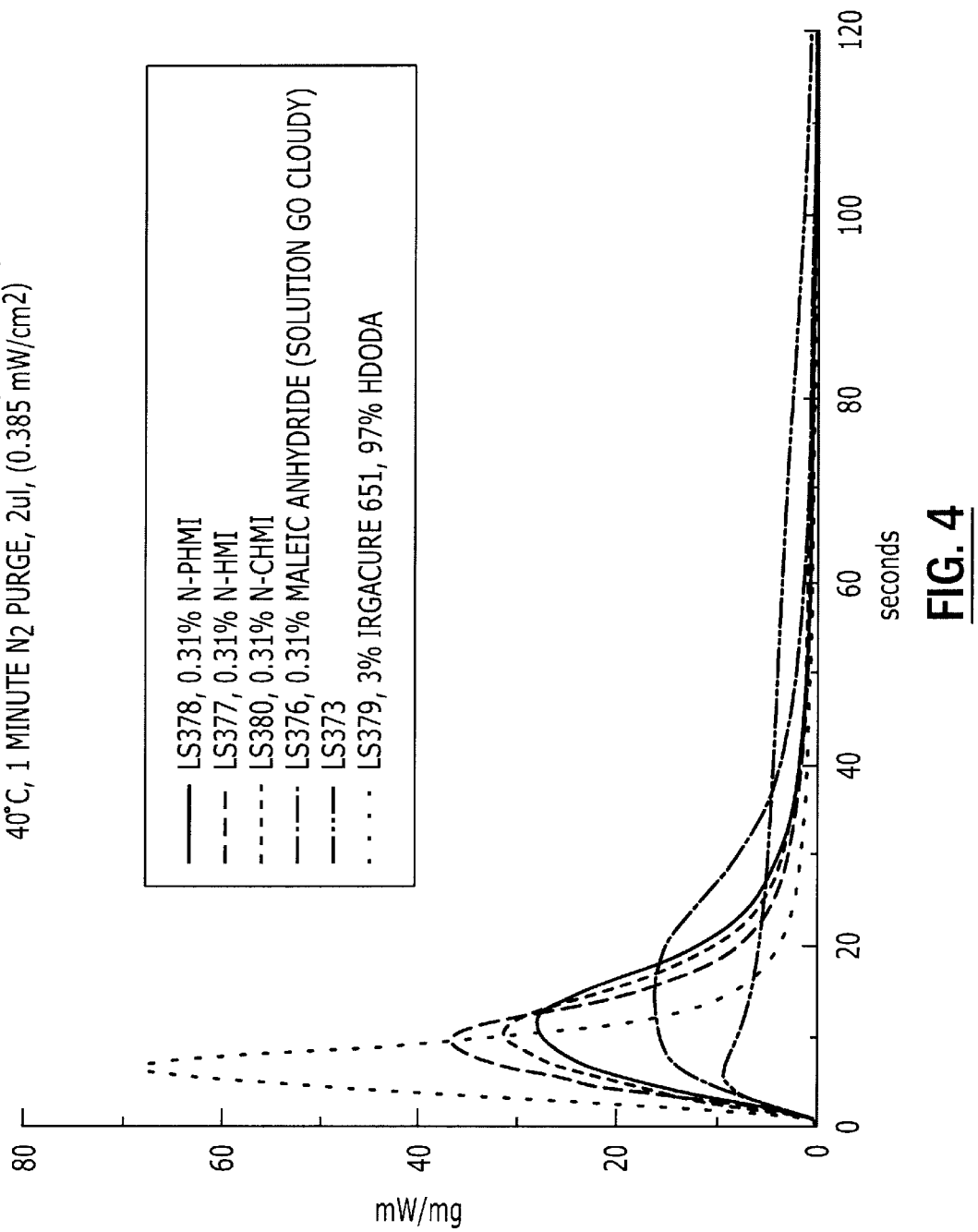
FIG. 4 is a graph illustrating photo-DSC exotherm rates for the photopolymerization of HDDA with photoinitiator packages of 3% BZPN/0.31% n-phenyl maleimide (N-PHMI)/1% NMDEA, 3% BZPN/0.31% N-hexyl maleimide (N-HMI)/1% NMDEA, 3% BZPN/0.31% N-cyclohexyl maleimide (N-CHMI)/1% NMDEA, 3% BZPN/0.31% maleic anhydride/1% NMDEA, and 3% BZPN/3% Irgacure 651 (α,α-dimethoxy deoxybenzoin (BDK))
Figure 5:
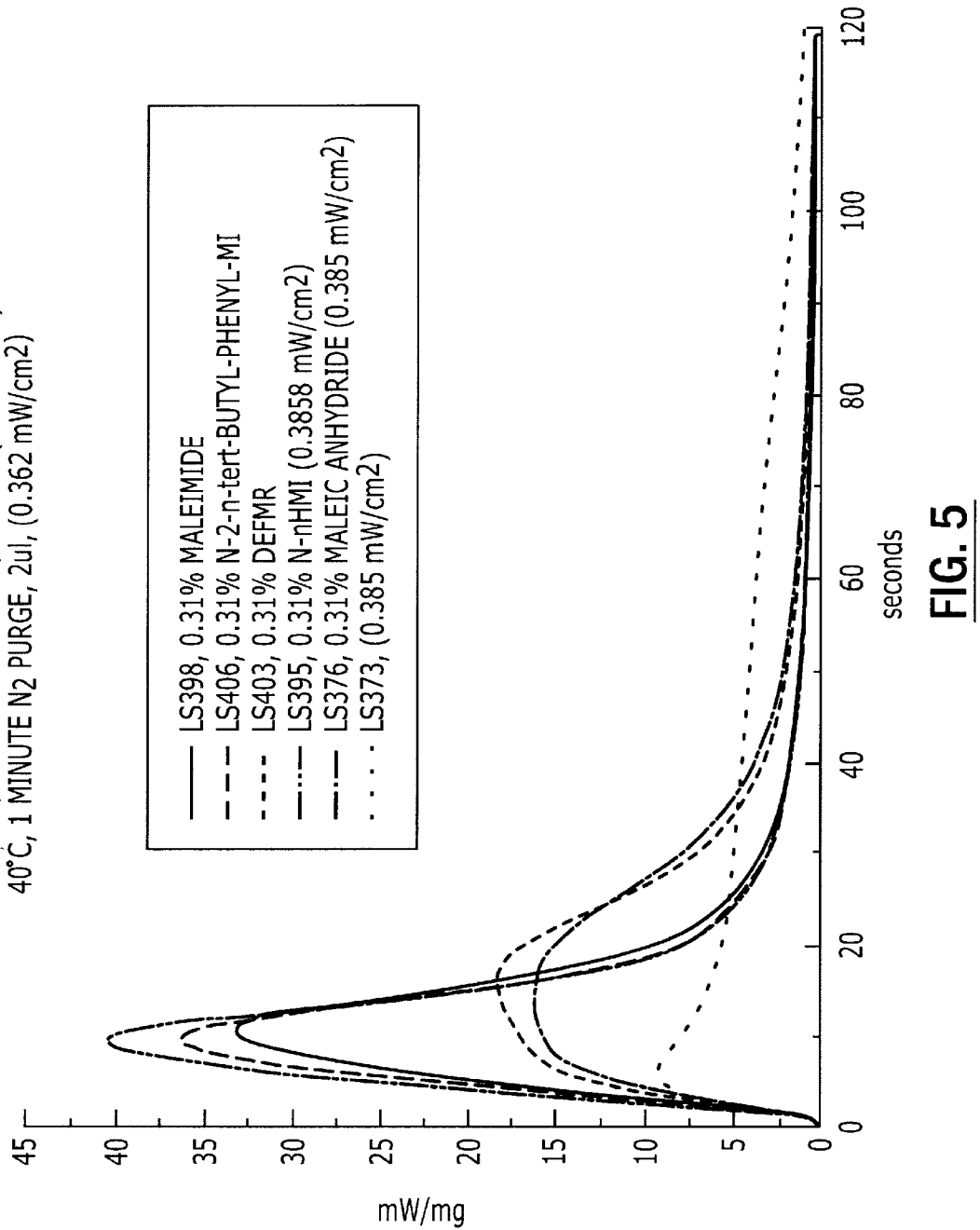
FIG. 5 is a graph illustrating photo-DSC exotherm rates for the photopolymerization of HDDA with photoinitiator packages of 3% BZPN/0.31% maleimide (MI)/1% NMDEA, 3% BZPN/0.31% N-2-n-tert-butyl-phenyl maleimide/1% NMDEA, 3% BZPN/0.31% DEFMR (diethylfumarate)/1% NMDEA, 3% BZPN/0.31% HMI/1% NMDEA, and 3% BZPN/0.31% maleic anhydride/1% NMDEA.

To extend the results shown in FIG. 3, exotherms were recorded for the photopolymerization of HDDA initiated by exposing benzophenone/N-alkyl maleimide/NMDEA and benzophenone/N-aryl maleimide/NMDEA systems to the output of a filtered (365-nm mercury line filter) source (FIGS. 4 and 5). When either an N-alkyl or an N-aryl maleimide was used in combination with the benzophenone sensitizer, a dramatic increase in the polymerization rate was observed as compared to results using the benzophenone/NMDEA system alone. Results for maleic anhydride (FIGS.

4 and 5) and Irgacure-651 (BDK) (FIG. 4) are shown for comparison. FIGS. 4 and 5 indicate that N-alkyl maleimides of widely varying structures (methyl maleimide MMI, hexyl maleimide HMI, and cyclohexyl maleimide CHMI) as well as both ortho-substituted (i.e., twisted) (tert-butyl maleimide NtBMI) N-aryl maleimides and simple substituted or unsubstituted (i.e., planar) (phenyl maleimide N-PMI) N-aryl maleimides (heretofore found to be ineffective upon direct excitation), can be sensitized to have much greater initiation efficiencies than benzophenone/NMDEA systems.

Although not wishing to be bound by any explanation of the invention, it is currently believed that energy transfer occurs from the exited state triplet of the benzophenone to the maleimide, which then abstracts a hydrogen atom and initiates the polymerization process.

EXAMPLE 18

Photopolymerization Using Thioxanthone/Amine/Maleimide Formulations

Additional studies examined the use of benzophenone derivatives, and in particular thioxanthone derivatives, to sensitize initiation by maleimides. Three types of experiments were performed using N-methyl maleimide and a variety of thioxanthone photoinitiators. Specific thioxanthones (available from First Chemical Corporation) include isopropyl thioxanthone (ITX), LTX having the formula

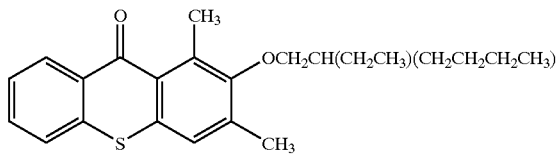

4-morpholinobenzophenone (XPI-115) having the formula

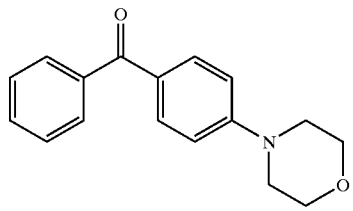

4,4'-diphenoxybenzophenone (XPI-113) having the formula

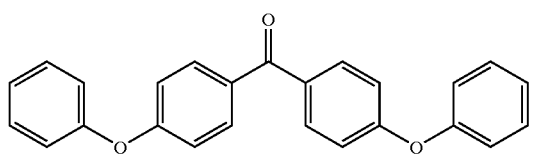

and XPI-133 having the formula

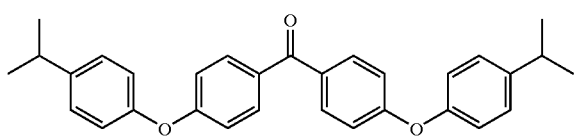

First, formulations with various photoinitiators were prepared containing HDDA and NMDEA, with and without MMI. These formulations were then tested by photo-differential scanning calorimetry (photo-DSC), using a Xenon-doped mercury lamp at 25° C. using (1) a 313 nm band pass filter, (2) a 365 nm band pass filter, and (3) the full arc of the lamp at different intensities.

313 nm Band Pass Filter (BPF) Experiments

At 313 nm, both the maleimide and the photoinitiator absorb photons, with the relative absorbance depending of the ratio of the respective molar extinction coefficients. Formulations were prepared to have equal absorbance of different benzophenone derivatives at 313 mrn. The experiments were performed in nitrogen, with a filtered light intensity of about 1 mW/cm$^2$.

The data in Table 1 show that when the maleimide is used in conjunction with ITX and XPI-115 at these concentrations and under these conditions, the average peak exotherm maximum (polymerization rate) is enhanced. Also, enhanced relative conversions are obtained when the maleimide is used in conjunction with ITX, XPI-113, XPI-115, and XPI-133.

TABLE 1

Data from 313 nm BPF Photo-DSC Experiments Using HDDA

| Photoinitiator | Formulation (mol % of compound) | Average Exotherm Peak Maximum (W/g) | Average Exotherm Integration (J/g) |
|---|---|---|---|
| ITX | 0.080% ITX 0.86% MDEA | 28.32 | 554.35 |
|  | 0.080% ITX 1.2% MDEA 0.66% MMI | 68.32 | 579.79 |
| LTX | 0.0113% LTX 1.07% MDEA | 21.3 | 481.93 |
|  | 0.0113% LTX 0.974% MDEA 0.608% MMI | 12.8 | 470.1 |
| XPI-113 | 0.013% XPI-113 109% MDEA | 20.69 | 469.38 |
|  | 0.012% XPI-113 1.09% MDEA 0.56% MMI | 15.99 | 504.39 |
| XPI-115 | 0.0025% XPI-115 1.18% MDEA | 24.42 | 481.9 |
|  | 0.0025% XPI-115 1.07% MDEA 063% MMI | 29.59 | 489.51 |
| XPI-133 | 0.0056% XPI-133 1.02% MDEA | 16.17 | 435.63 |
|  | 0.0055% XPI-133 1.03% MDEA 0.607% MMI | 10.63 | 470.66 |

365 nm BPF Experiments

A second set of photo-DSC experiments were performed which were similar to those reported above except that a 365 nm band pass filter was used in place of the 313 nm band pass filter. At 365 nm, the principle absorbing species in these formulations should be the photoinitiator. Exotherm data from these experiments are shown below in Table 2.

TABLE 2

Data from 365 nm BPF Photo-DSC Experiments Using HDDA

| Photoinitiator | Formulation (mol % of compound) | Average Exotherm Peak Maximum (W/g) | Average Exotherm Integration (J/g) |
|---|---|---|---|
| ITX | 0.090% ITX 0.942% MDEA | 18.13 | 447.69 |
|  | 0.090% ITX 1.0% MDEA 0.62% MMI | 63.45 | 521.39 |
| LTX | 0.013% LTX 1.07% MDEA | 23.77 | 508.91 |
|  | 0.0113% LTX 0.974% MDEA 0.608% MMI | 42.96 | 509.14 |

At these concentrations and under these conditions, there is dramatic enhancement of the maximum rates of polymerization when the maleimide is used in conjunction with ITX as well as with LTX. There is also enhancement of the relative conversion when the maleimide is included in the formulations. Absolute comparisons between ITX and LTX should not be made using this data, as the formulations were not prepared with equal photoinitiator absorption at 365 nm.

Full Arc Experiments

Two formulations of HDDA with ITX, MDEA, with and without MMI were also tested using the full arc of the lamp at three different intensities, in nitrogen and in air. Peak exotherm maxima are listed below in Table 3. In nitrogen, at low intensity (30 mW/cm$^2$), the formulation with the maleimide is approximately twice as efficient as that without. As the intensity increases to 100 and 300 mW/cm$^2$, the ratio between with maleimide and without decreases, while the absolute peak exotherm values continue to increase, as expected. In air, at 30 mW/cm$^2$, there is little difference between the exotherms of the two formulations. However, as the intensity increases to 100 and 300 mW/cm$^2$, the ratio (with MMI/without MMI) goes from 1.06 to 1.12 to 1.34, and the exotherm peak values get larger.

TABLE 3

Data from full arc photo-DSC experiments with HDDA

| Formulation (mol % of compound) | Light Intensity (mW/cm$^2$) | Exotherm Peak Maximum (W/g) Nitrogen | Exotherm Peak Maximum (W/g) Air |
|---|---|---|---|
| 0.090% ITX 0.942% MDEA | 30 | 50 | 39 |
|  | 100 | 73 | 64 |
|  | 300 | 97 | 77 |
| 0.090% ITX 1.0% MDEA 0.61% MMI | 30 | — | 41 |
|  | 100 | 97 | 80 |
|  | 300 | 129 | 104 |

Short Duration Irradiation Photo-DSC Experiments

To investigate the performance of sensitized maleimide-acrylic formulations in air a third battery of experiments was performed using formulations of HDDA, MDEA, and ITX, and with and without methyl maleimide. These photo-DSC experiments were performed at 25° C. in nitrogen and in air with 1 second irradiation times using a shuttered xenon-doped mercury light source.

The experiments were conducted in the absence of a filter, in nitrogen and in air, at light intensities from 30 to 750 mW/cm$^2$. Three formulations were tested containing HDDA, MDEA, and ITX, with and without MMI. Representative exotherm peak maxima and exotherm integration values are shown below in Table 4.

TABLE 4

Data from 1-Second Exposure Photo-DSC Experiments with HDDA and ITX

| | Formulations (mol % of compound) | | | | | |
|---|---|---|---|---|---|---|
| Light In- | 0.090% ITX 0.942% MDEA | | 0.090% ITX 1.0% MDEA 0.62% MMI | | 0.0090% ITX 1.01% MDEA 0.0806% MMI | |
| tensity (mW/ cm$^2$) | Peak Maximum (W/g) | Peak Integral (J/g) | Peak Maximum (W/g) | Peak Integral (J/g) | Peak Maximum (W/g) | Peak Integral (J/g) |
| Values in Nitrogen | | | | | | |
| 30 | 10.25 | 55.30 | 31.63 | 155.97 | 58.57 | 272.24 |
| 100 | 25.61 | 108.70 | 77.16 | 400.42 | 104.95 | 477.98 |
| 300 | 51.06 | 216.73 | 111.13 | 531.72 | 122.04 | 524.88 |
| 500 | 66.52 | 317.29 | 117.97 | 545.81 | — | — |
| 750 | 93.68 | 414.60 | 135.31 | 564.38 | — | — |
| Values in Air | | | | | | |
| 30 | 9.29 | 36.49 | 2.21 | 9.34 | 14.54 | 55.71 |
| 100 | 23.26 | 91.58 | 30.90 | 132.60 | 65.20 | 281.53 |
| 300 | 38.91 | 170.58 | 100.60 | 429.47 | 111.87 | 449.55 |
| 500 | 57.56 | 242.04 | 115.17 | 475.92 | — | — |
| 750 | — | — | 124.72 | 510.68 | — | — |

From this data, it can be clearly observed that in nitrogen, at all intensities and at both concentrations of MMI, the formulations containing maleimide perform much better than the HDDA formulation with only ITX and amine.

Another useful comparison is that between the sensitized maleimide/ITX/amine initiating system and a typical conventional alpha-cleavage type photoinitiator. A short set of experiments was performed using one of the sensitized maleimide containing formulations from above and an HDDA formulation which contained 2,2-dimethoxy-2-phenylacetophenone (known commercially as BDK and Irgacure 651). These photo-DSC runs were conducted at 25° C. in nitrogen, at 100 mW/cm$^2$ on-sample light intensity, with a one second exposure time. Photo-DSC exotherm values are given below in Table 5. The sensitized maleimide-containing formulation gave a peak maximum on average about 69% of the peak maximum obtained with the Irgacure 651 formulation. The relative double bond conversion for the sensitized maleimide initiated formulations was about 79% of that obtained when the conventional alpha-cleavage photoinitiator was used. It is interesting to note that there is 0.97 weight percent initiator in the case of the Irgacure 651/HDDA formulation, but only 0.59 weight percent of initiating system in the maleimide/ITX/MDEA/HDDA formulation.

TABLE 5

Photo-DSC Exotherm Values Comparing Maleimide/ITX/MDEA to IC651 in HDDA

| Formulation (mol % of compound) | Average Exotherm Peak Maximum (W/g) | Average Exotherm Peak Integration (J/g) |
|---|---|---|
| 0.0090% ITX 1.01% MDEA 0.0806% MMI | 108.37 | 489.36 |
| 0.86% Irgacure 651 | 156.70 | 622.82 |

Sensitization of Aromatic Maleimides

Experiments were also performed to determine if initiation of acrylic systems via sensitized aromatic maleimides is possible. Formulations were prepared using HDDA, ITX, and MDEA with several aromatic maleimides. The aromatic maleimides used in these experiments are N-phenylmaleimide (PMI), N-(2-trifluoromethylphenyl) maleimide (2CF3PMI), N-(2-t-butylphenyl)maleimide (2tBPMI), and α-methyl-N-(2-trifluoromethyl phenyl) maleimide (2CF3PCI). Photo-DSC experiments were conducted in nitrogen at 25° C. using a medium pressure mercury lamp fitted with a 365 nm band pass filter, with an unfiltered on-sample light intensity of 28 mW/cm². Exotherm peak maxima are listed below in Table 6. The data demonstrates that aromatic maleimides can be "sensitized" (again, though sensitization has not been proven mechanistically) using ITX in acrylic systems. Also very significant is that the aromatic maleimides are not required to be "twisted" (as in the initiation of acrylic systems by direct excitation of the maleimide), as N-phenyl maleimide appears to have the same synergistic effect.

TABLE 6

Photo-DSC Peak Maxima for ITX/MDEA/Arylmaleimides in HDDA

| Formulation (mol % of compound) | 0.040% ITX 1.00% MDEA | 0.040% ITX 0.976% MDEA 0.309% PMI | 0.040% ITX 0.996% MDEA 0.311% 2CF3PMI | 0.040% ITX 1.03% MDEA 0.313% 2tBPMI | 0.040% ITX 1.04% MDEA 0.325% 2CF3PCI |
|---|---|---|---|---|---|
| Exotherm Peak Maximum (W/g) | 12 | 34 | 40 | 42 | 46 |

In summary, the data reported herein show that a dramatic synergistic effect occurs when N-aliphatic and N-aromatic maleimides are used in conjunction with benzophenone/thioxanthone photoinitiators in the presence of an amine hydrogen atom-donor in hexanedioldiacrylate. Although not wishing to be bound by any explanation of the invention, this effect likely occurs through excitation of the conventional photoinitiator followed by energy transfer to the maleimide, which then hydrogen-atom abstracts and initiates free-radical polymerization. Both aliphatic and aromatic maleimides appear to exhibit the synergism, and the aromatic maleimides are not required to be "twisted" (the phenyl ring out of plane with respect to the maleimide ring). Specifically, synergism leading to enhanced rates of cure and enhanced conversions has been observed when N-methylmaleimide is used at low concentrations in conjunction with benzophenone, ITX, LTX, and XPI-115. Enhanced conversions are also noted when MMI is used in conjunction with XPI-113 and XPI-133. Similar results have been observed using N-aromatic maleimides including N-phenylmaleimide, N-(2-trifluoromethylphenyl) maleimide, N-(2-t-butyl phenyl) maleimide, and α-methyl-N-(2-trifluoromethyl phenyl)maleimide. Under conditions designed to begin to simulate industrial curing conditions, sensitized maleimide-containing acrylic formulations were observed to have higher rates of cure and higher relative conversions in air than the same formulations without the maleimide in nitrogen.

The foregoing examples are illustrative of the present invention and are not to be construed as limiting thereof. Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A photopolymerizable composition comprising at least one photopolymerizable compound having at least one ethylenically unsaturated double bond, at least one maleimide compound capable of initiating photopolymerization of said ethylenically unsaturated compound in an amount of about 0.01 to about 2 mole percent, and at least one photoactive benzophenone compound which is a sensitizer capable of sensitizing initiation of the ethylenically unsaturated compound by said maleimide.

2. The composition of claim 1, wherein said at least one maleimide compound is selected from the group consisting of alkyl maleimides, functionalized aliphatic maleimides, aromatic maleimides, maleimide, maleic anhydride, and mixtures thereof.

3. The composition of claim 2, wherein said maleimide compound comprises an alkyl maleimide of the formula

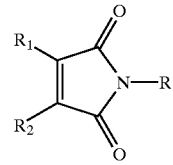

wherein:
each $R_1$ and $R_2$ is independently selected from the group consisting of hydrogen, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system; and R is straight chain, branched or cyclic C1–C10 alkyl, optionally substituted with one or more C1–C4 alkyl.

4. The composition of claim 3, wherein said alkyl maleimide is selected form the group consisting of methyl maleimide, hexyl maleimide, cyclohexyl maleimide, and mixtures thereof.

5. The composition of claim 2, wherein said functionalized aliphatic maleimide comprises a compound of the formula:

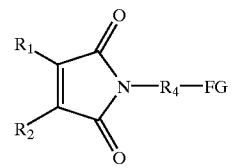

wherein:
(a) each $R_1$ and $R_2$ is independently selected from the group consisting of hydrogen, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system;
(b) $R_4$ is linear or branched C1 to C10 alkyl, heteroatom, or silicon —$SiH_2$—; and (c1) when $R_4$ is C1 to C10 alkyl, FG is a functional group selected from the group consisting of —$OR_3$, —$SR_3$, —$SiH_2R_3$, —$OC(O)N(R_3)_2$, —$OC(O)C(=CHR_3)R_3$, —$OC(O)R_3$, —$C(O)R_3$, —$N(R_3)_2$, —$C(O)OR_3$, —NCO, —$C(O)N(R_3)_2$, —$OC(O)OR_3$, —CN, halogen, —$CH_2$N-aryl-FG', —$CH_2$N-aryl-$R_3$-FG', sulfonic acid, quaternary ammonium, and salts thereof, in which each $R_3$ is selected from the group consisting of hydrogen, alkyl, aryl, cycloalkyl, arylalkyl, and alkylaryl, and in which FG' is selected from the group consisting of —$OR_3$, —$SR_3$, —$SiH_2R_3$, —$OC(O)N(R_3)_2$, —$OC(O)C(=CHR_3)R_3$, —$OC(O)R_3$, —$C(O)R_3$, —$N(R_3)_2$, —$C(O)OR_3$, —NCO, —$C(O)N(R_3)_2$, —$OC(O)OR_3$, —CN, halogen, sulfonic acid, and quaternary ammonium, or (c2) when $R_4$ is a heteroatom or silicon —$SiH_2$—, FG is selected from the group consisting of hydrogen, alkyl, aryl, cycloalkyl, alkylaryl, arylalkyl, alkyl-FG", and aryl-FG", wherein FG" is the same as FG' as defined in (c1) above, or (c3) FG is a functional group as defined in (c1) in combination with a spacer group linking said maleimide unit with at least one other maleimide unit to form a di- or multifunctional maleimide compound.

6. The composition of claim 5, wherein said functionalized aliphatic maleimide is selected from the group consisting of hydroxy methylmaleimide, hydroxy ethylmaleimide, triethylene glycol biscarbonate bisethylmaleimide, 2-ethylcarbonate ethylmaleimide, 2-isopropyl urethane ethylmaleimide, 2-acryloyl ethylmaleimide, acetoxy ethyl maleimide, isophorone bisurethane bisethylmaleimide, bisethylmaleimide carbonate, 4,9-dioxa-1,12 dodecane bismaleimide, bispropyl maleimide, dodecane N,N'-bismaleimide, and mixtures thereof.

7. The composition of claim 2, wherein said aromatic maleimide comprises a compound of the formula

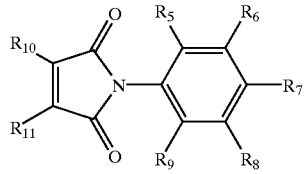

wherein:
each of $R_5$, $R_6$, $R_7$, $R_8$, and $R_9$ is independently selected from the group consisting of H, $CX_3$, $COOR_{12}$, $COR_{12}$, $OR_{12}$, CN, $SR_{12}$, $N(R_{12})_2$, $R_{13}$, X, and MI;

$R_{10}$ and $R_{11}$ each is independently selected from the group consisting of H, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system;

X is halide;

$R_{12}$ is selected from the group consisting of H, lower alkyl, cycloalkyl, and aryl;

$R_{13}$ is selected from the group consisting of lower alkyl, cycloalkyl, and aryl, or $R_{13}$ is a spacer group connecting at least two compounds of the above formula to form a di- or multi-functional maleimide; and MI is

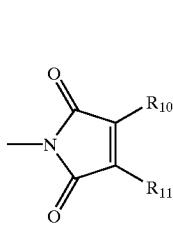

wherein $R_{10}$ and $R_{11}$ are as defined above.

8. The composition of claim 7, wherein said aromatic maleimide is selected from the group consisting of phenyl maleimide, N-(2-$CF_3$-phenyl)maleimide, N-(2-t-butylphenyl)maleimide, N-(2-$CF_3$-phenyl) methylmaleimide, N-(2,4,6-isopropyl-3-maloimide phenyl) maleimide, N-(2-iodophenyl)maleimide, N-(2-bromo-3,5-$CF_3$-phenyl) maleimide, di(4-maleimido phenyl)methane, N-(2-chlorophenyl) maleimide, N-(2-bromophenyl) maleimide, N-(2-fluorophenyl) maleimide, N-(4-$CF_3$-phenyl) maleimide, di(3,5-diethyl-4-maleimidophenyl) methane, and mixtures thereof.

9. A photopolymerizable composition comprising at least one photopolymerizable compound having at least one ethylenically unsaturated double bond, at least one maleimide compound capable of initiating photopolymerization of said ethylenically unsaturated compound of the formula

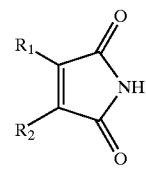

wherein each $R_1$ and $R_2$ is independently selected from the group consisting of hydrogen, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system, and at least one photoactive compound without a maleimide functionality which is a sensitizer capable of sensitizing initiation of the ethylenically unsaturated compound by said maleimide.

10. A photopolymnerizable composition comprising at least one photopolymerizable compound having at least one ethylenically unsaturated double bond at least one maleic anhydride capable of initiating photopolymeration of said ethylenically unsaturated compound of the formula

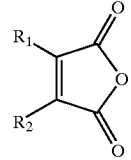

wherein each $R_1$ and $R_2$ is independently selected from the group consisting of hydrogen, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system, and at least one photoactive compound without a maleimide functionality which is a sensitizer capable of sensitizing initiation of the ethylenically unsaturated compound by said maleic anhydride.

11. The composition of claim 1, wherein said benzophenone compound comprises a compound of the formula

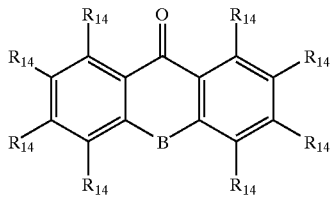

wherein:
B is (H,H), —CH$_2$—, —S—, —O—, —CO—, —NR$_{15}$—, or a bond bridging the two aromatic rings;
each R$_{14}$ is independently selected from the group consisting of hydrogen, alkyl, cycloalkyl, alkoxy, aryl, alkylaryl, arylalkyl, halogen, trihaloalkyl, —CN, —NO$_2$, —C(O)OR$_{15}$, —C(O)R$_{15}$, —OR$_{15}$, —N(R$_{15}$)$_2$, —OC(O)CR$_{15}$=CHR$_{15}$, R$_{16}$, —OR$_{16}$, —R$_{17}$—OC(O)CR$_{15}$=CHR$_{15}$, polymnerizable moieties, and oligomeric and polymeric moieties;
R$_{15}$ is selected from the group consisting of hydrogen, alkyl, aryl, cycloalkyl, arylalkyl, and alkylaryl;
R$_{16}$ is one or more saturated or unsaturated five or six membered hydrocarbon or heterocyclic ring system, optionally substituted with one or more alkyl, cycloalkyl, or halogen; and
R$_{17}$ is selected from the group consisting of alkyl, aryl, cycloalkyl, arylalkyl, and alkylaryl.

12. The composition of claim 1, wherein said benzophenone compound is selected from the group consisting benzophenone, thioxanthone, isopropylthioxanthone, chloroxanthone, 4-morpholinobenzophenone, 4,4'-diphenoxybenzophenone, methyl o-benzoylbenzoate, 1-methyl-2-(2-ethylhexyloxy)thioxanthone, 4,4'-di-(4-isopropylphenoxy)benzophenone, acrylic acid 4-benzoylphenyl ester, 4,4'-diphenylbenzophenone, 4-phenylbenzophenone, and mixtures thereof.

13. The composition of claim 1, wherein said at least one photopolymerizable compound is selected from the group consisting of monomers and oligomers derived from acrylic and methacrylic acid, optionally dispersed or dissolved in a solvent that is copolymerizable therewith.

14. The composition of claim 13, wherein said photopolymerizable compound is selected from the group consisting of methyl acrylate, ethyl acrylate, n- or tert-butylacrylate, isooctyl acrylate, methyl methacrylate, ethylmethacrylate, 2-ethylhexyl methacrylate, butylacrylate, isobutyl methacrylate, hydroxy acrylates, glycol acrylates, allyl acrylates, epoxy acrylates, aminoplast acrylates, acrylated epoxides, acrylated polyesters, acrylated polyurethanes, and mixtures thereof.

15. The composition of claim 1, wherein said composition further comprises at least one hydrogen atom donor compound.

16. The composition of claim 15, wherein said hydrogen atom donor compound comprises a tertiary amine.

17. The composition of claim 1, wherein said photopolymerizable compound comprises a hydrogen atom donor molecular component.

18. A method of polymerizing a polymerizable compound having at least one ethylenically unsaturated double bond, comprising exposing said compound to radiation in the presence of at least one maleimide compound in an amount of about 0.01 to about 2 mole percent and at least one photoactive benzophenone compound, wherein said maleimide initiates photopolymerization of said ethylenically unsaturated compound and wherein said photoactive benzophenone compound sensitizes initiation of the ethylenically unsaturated compound by said maleimide.

19. The method of claim 18, wherein said at least one maleimide compound is selected from the group consisting of alkyl maleimides, functionalized aliphatic maleimides, aromatic maleimides, maleimide, maleic anhydride, and mixtures thereof.

20. The method of claim 19, wherein said maleimide compound comprises an alkyl maleimide of the formula

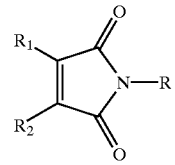

wherein:
each R$_1$ and R$_2$ is independently selected from the group consisting of hydrogen, C1 to C10 alkyl, cycloalkyl, aryl, alkoxy, and halogen, or R$_1$ and R$_2$ together form a fused substituted or unsubstituted saturated or unsaturated five or six membered cyclic hydrocarbon or heterocyclic ring system; and
R is straight chain, branched or cyclic C1–C10 alkyl, optionally substituted with one or more C1–C4 alkyl.

21. The method of claim 20, wherein said alkyl maleimide is selected form the group consisting of methyl maleimide, hexyl maleimide, cyclohexyl maleimide, and mixtures thereof.

22. The method of claim 19, wherein said functionalized aliphatic maleimide comprises a compound of the formula:

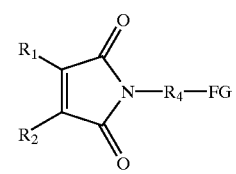

wherein:
(a) each R$_1$ and R$_2$ is independently selected from the group consisting of hydrogen, C1 to C10 alkyl, cycloalkyl, aryl, alkoxy, and halogen, or R$_1$ and R$_2$ together form a fused substituted or unsubstituted saturated or unsaturated five or six membered cyclic hydrocarbon or heterocyclic ring system;
(b) R$_4$ is linear or branched C1 to C10 alkyl, heteroatom, or silicon —SiH$_2$—; and
(c1) when R$_4$ is C1 to C10 alkyl, FG is a functional group selected from the group consisting of —OR$_3$, —SR$_3$, —SiH$_2$R$_3$, —OC(O)N(R$_3$)$_2$, —OC(O)C(=CHR$_3$)R$_3$, —OC(O)R$_3$, —C(O)R$_3$, —N(R$_3$)$_2$, —C(O)OR$_3$, —NCO, —C(O)N(R$_3$)$_2$, —OC(O)OR$_3$, —CN, halogen, —CH$_2$N-aryl-FG', —CH$_2$N-aryl-R$_3$—FG', sulfonic acid, quaternary ammonium, and salts thereof, in which each R$_3$ is selected from the group consisting of hydrogen, alkyl, aryl, cycloalkyl, arylalkyl, and alkylaryl, and in which FG' is selected from the group consisting of —OR$_3$, —SR$_3$, —SiH$_2$R$_3$, —OC(O)N(R$_3$)$_2$, —OC(O)C(=CHR$_3$)R$_3$, —OC(O)R$_3$, —C(O)R$_3$, —N(R$_3$)$_2$, —C(O)OR$_3$, —NCO, —C(O)N(R$_3$)$_2$, —OC(O)OR$_3$, —CN, halogen, sulfonic acid, and quaternary ammonium, or (c2) when $R_4$ is a heteroatom or silicon —SiH$_2$—, FG is selected from the group consisting of hydrogen, alkyl, aryl, cycloalkyl, alkylaryl, arylalkyl, alkyl-FG", and aryl-FG", wherein FG" is the same as FG' as defined in (c1) above, or (c3) FG is a functional group as defined in (c1) in combination with a spacer group linking said maleimide unit with at least one other maleimide unit to form a di- or multifunctional maleimide compound.

23. The method of claim 22, wherein said functionalized aliphatic maleimide is selected from the group consisting of hydroxy methylmaleimide, hydroxy ethylmaleimide, triethylene glycol biscarbonate bisethylmaleimide, 2-ethylcarbonate ethylmaleimide, 2-isopropyl urethane ethylmaleimide, 2-acryloyl ethylmaleimide, acetoxy ethyl maleimide, isophorone bisurethane bisethylmaleimide, bisethylmaleimide carbonate, 4,9-dioxa-1,12 dodecane bismaleimide, bispropyl maleimide, dodecane N,N'-bismaleimide, and mixtures thereof.

24. The method of claim 19, wherein said aromatic maleimide comprises a compound of the formula

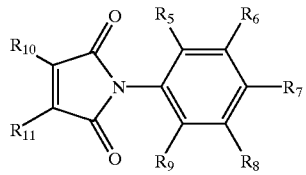

wherein:
each of $R_5$, $R_6$, $R_7$, $R_8$, and $R_9$ is independently selected from the group consisting of H, CX$_3$, COOR$_{12}$, COR$_{12}$, OR$_{12}$, CN, SR$_{12}$, N(R$_{12}$)$_2$, R$_{13}$, X, and MI;
$R_{10}$ and $R_{11}$ each is independently selected from the group consisting of H, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system;
X is halide;
$R_{12}$ is selected from the group consisting of H, lower alkyl, cycloalkyl, and aryl;
$R_{13}$ is selected from the group consisting of lower alkyl, cycloalkyl, and aryl, or $R_{13}$ is a spacer group connecting at least two compounds of the above formula to form a di- or multi-functional maleimide; and
MI is

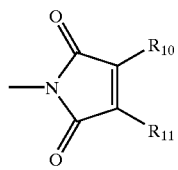

wherein $R_{10}$ and $R_{11}$ are as defined above.

25. The method of claim 24, wherein said aromatic maleimide is selected from the group consisting of phenyl maleimide, N-(2-CF$_3$-phenyl)maleimide, N-(2-t-butylphenyl)maleimide, N-(2-CF$_3$-phenyl)methylmaleimide, N-(2,4,6-isopropyl-3-maloimide phenyl) maleimide, N-(2-iodophenyl)maleimide, N-(2-bromo-3,5-CF$_3$-phenyl)maleimide, di(4-maleimido phenyl)methane, N-(2-chlorophenyl) maleimide, N-(2-bromophenyl) maleimide, N-(2-fluorophenyl) maleimide, N-(4-CF$_3$-phenyl) maleimide, di(3,5-diethyl-4-maleimidophenyl) methane, and mixtures thereof.

26. A method of polymerizing a compound having at least one ethylenically unsaturated double bond, comprising exposing said compound to radiation in the presence of at least one maleimide compound of the formula

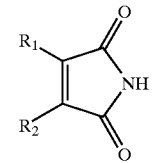

wherein each $R_1$ and $R_2$ is independently selected from the group consisting of hydrogen, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system, and at least one photoactive compound without a maleimide functionality, wherein said maleimide compound initiates photopolymerization of said ethylenically unsaturated compound and wherein said photoactive compound sensitizes initiation of the ethylenically unsaturated compound by said maleimide.

27. A method of polymerizing a compound having at least one ethylenicaUy unsaturated double bond, comprising exposing said compound to radiation in the presence of at least one maleic anhydride of the formula

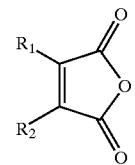

wherein each $R_1$ and $R_2$ is independently selected from the group consisting of hydrogen, C1 to C10 alky), cycloalkyl, aryl, alkoxy, and halogen, or $R_1$ and $R_2$ together form a fused substituted or unsubstituted saturated or unsaturated five or six membered cyclic hydrocarbon or heterocyclic ring system, and at least one photoactive compound without a maleimide functionality, wherein said maleimide compound initiates photopolymerization of said ethylenically unsaturated compound and wherein said photoactive compound sensitizes initiation of the ethylenically unsaturated compound by said maleic anhydride.

28. The method of claim 18, wherein said benzophenone compound has the formula

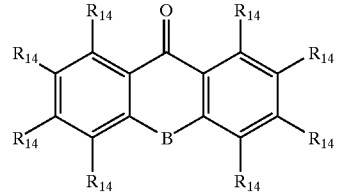

wherein:
B is (H,H), —CH$_2$—, —S—, —O—, —CO—, —NR$_{15}$—, or a bond bridging the two aromatic rings;
each $R_{14}$ is independently selected from the group consisting of hydrogen, alkyl, cycloalkyl, alkoxy, aryl, alkylaryl, arylalkyl, halogen, trihaloalkyl, —CN, —NO$_2$, —C(O)OR$_{15}$, —C(O)R$_{15}$, —OR$_{15}$, —N(R$_{15}$)$_2$, —OC(O)CR$_{15}$=CHR$_{15}$, R$_{16}$, —OR$_{16}$, —R$_{17}$—OC(O) CR$_{15}$=CHR$_{15}$, polymerizable moieties, and oligomeric and polymeric moieties;

R$_{15}$ is selected from the group consisting of hydrogen, alkyl, aryl, cycloalkyl, arylalkyl, and alkylaryl;

R$_{16}$ is one or more saturated or unsaturated five or six membered hydrocarbon or heterocyclic ring system, optionally substituted with one or more alkyl, cycloalkyl, or halogen; and R$_{17}$ is selected from the group consisting of alkyl, aryl, cycloalkyl, arylalkyl, and alkylaryl.

29. The method of claim 18, wherein said benzophenone compound is selected from the group consisting benzophenone, thioxanthone, isopropylthioxanthone, chlorothioxanthone, 4-morpholinobenzophenone, 4,4'-diphenoxybenzophenone, methyl o-benzoylbenzoate, 1-methyl-2-(2-ethylhexyloxy)thioxanthone, 4,4'-di-(4-isopropylphenoxy)benzophenone, acrylic acid 4-benzoylphenyl ester, 4,4'-diphenylbenzophenone, 4-phenylbenzophenone, and mixtures thereof.

30. The method of claim 18, wherein said at least one photopolymerizable compound is selected from the group consisting of monomers and oligomers derived from acrylic and methacrylic acid, optionally dispersed or dissolved in a solvent that is copolymerizable therewith.

31. The method of claim 30, wherein said photopolymerizable compound is selected from the group consisting of methyl acrylate, ethyl acrylate, n- or tert-butylacrylate, isooctyl acrylate, methyl methacrylate, ethylmethacrylate, 2-ethylhexyl methacrylate, butylacrylate, isobutyl methacrylate, hydroxy acrylates, glycol acrylates, allyl acrylates, epoxy acrylates, aminoplast acrylates, acrylated epoxides, acrylated polyesters, acrylated polyurethanes, and mixtures thereof.

32. The method of claim 18, wherein said composition further comprises a hydrogen atom donor compound.

33. The method of claim 32, wherein said hydrogen atom donor comprises a tertiary amine.

34. The method of claim 18, wherein said photopolymerizable compound comprises a hydrogen atom donor molecular component.

35. The composition of claim 1, wherein said maleimide compound comprises an aromatic maleimide of the formula

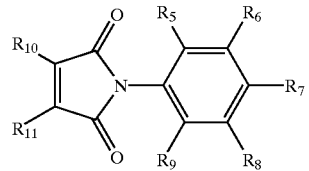

wherein:

each R$_5$, R$_6$, R$_8$, R$_9$, R$_{10}$ and R$_{11}$ is H; and

R$_7$ is a spacer group connecting at least two compounds of the above formula to form a di- or multi-functional maleimide.

36. The composition of claim 35, wherein said aromatic maleimide is

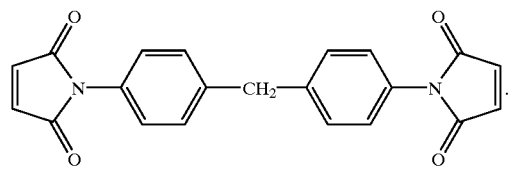

37. The composition of claim 1, wherein said photoactive benzophenone compound comprises a benzophenone compound of the formula

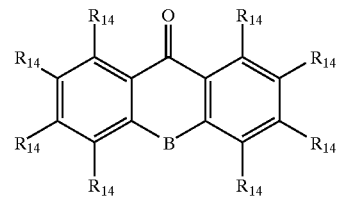

wherein:

B is (H,H);

at least one R$_{14}$ is aryl and the other R$_{14}$ are hydrogen;

R$_{15}$ is selected from the group consisting of hydrogen, alkyl, aryl, cycloalkyl, arylalkyl, and alkylaryl;

R$_{16}$ is one or more saturated or unsaturated five or six membered hydrocarbon or heterocyclic ring system, optionally substituted with one or more alkyl, cycloalkyl, or halogen; and R$_{17}$ is selected from the group consisting of alkyl, aryl, cycloalkyl, arylalkyl, and alkylaryl.

38. The composition of claim 37, wherein said benzophenone compound is 4-phenylbenzophenone.

39. A photopolymerizable composition comprising at least one photopolymerizable compound having at least one ethylenically unsaturated double bond, di(4-maleimidophenyl)methane and 4-phenylbenzophenone.

40. A method of polymerizing a polymerizable compound having at least one ethylenically unsaturated double bond, comprising exposing said compound to radiation in the presence of di(4-maleimidophenyl)methane and 4-phenylbenzophenone.

41. A photopolymerizable composition comprising at least one photopolymerizable compound having at least one ethylenically unsaturated double bond, at least one maleimide capable of initiating photopolymerization of said ethylenically unsaturated compound in an amount of about 0.01 to about 2 mole percent, and at least one photoactive compound without a maleimide functionality which is a sensitizer capable of sensitizing initiation of the ethylenically unsaturated compound by said maleimide, wherein said maleimide compound comprises an alkyl maleimide of the formula

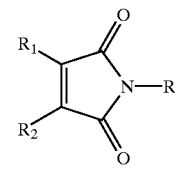

wherein:

each R$_1$ and R$_2$ is independently selected from the group consisting of hydrogen, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system; and R is straight chain, branched or cyclic C1–C10 alkyl, optionally substituted with one or more C1–C4 alkyl.

42. The composition of claim 41, wherein said alkyl maleimide is selected form the group consisting of methyl maleimide, hexyl maleimide, cyclohexyl maleimide, and mixtures thereof.

43. A photopolymerizable composition comprising at least one photopolymerizable compound having at least one ethylenically unsaturated double bond, at least one maleimide capable of initiating photopolymerization of said ethylenically unsaturated compound in an amount of about 0.01 to about 2 mole percent, and at least one photoactive benzophenone compound which is a sensitizer capable of sensitizing initiation of the ethylenically unsaturated compound by said maleimide, wherein said benzophenone compound comprises a compound of the formula

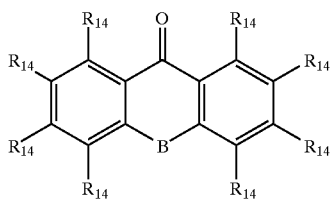

wherein:
B is (H,H), —$CH_2$—, —S—, —CO—, —$NR_{15}$—, or a bond bridging the two aromatic rings;

each $R_{14}$ is independently selected from the group consisting of hydrogen, alkyl, cycloalkyl, alkoxy, aryl, alkylaryl, arylalkyl, halogen, trihaloalkyl, —CN, —$NO_2$, —$C(O)OR_{15}$, —$C(O)R_{15}$, —$OR_{15}$, —$N(R_{15})_2$, —$OC(O)CR_{15}$=$CHR_{15}$, $R_{16}$, —$OR_{16}$, —$R_{17}$—OC(O)$CR_{15}$, polymerizable moieties, and oligomeric and polymeric moieties;

$R_{15}$ is selected from the group consisting of hydrogen, alkyl, aryl, cycloalkyl, arylalkyl, and alkylaryl;

$R_{16}$ is one or more saturated or unsaturated five or six membered hydrocarbon or heterocyclic ring system, optionally substituted with one or more alkyl, cycloalkyl, or halogen; and $R_{17}$ is selected from the group consisting of alkyl, aryl, cycloalkyl, arylalkyl, and alkylaryl.

44. A photopolymerizable composition, comprising at least one photopolymerizable compound having at least one ethylenically unsaturated double bond, at least one maleimide capable of initiating photopolymerization of said ethylenically unsaturated compound in an amount of about 0.01 to about 2 mole percent, and at least one photoactive benzophenone compound which is a sensitizer capable of sensitizing initiation of the ethylenically unsaturated compound by said maleimide, wherein said benzophenone compound is selected from the group consisting benzophenone, thioxanthone, isopropylthioxanthone, chloroxanthone, 4-morpholinobenzophenone, 4,4'-diphenoxybenzophenone, methyl o-benzoylbenzoate, 1-methyl-2-(2-ethylhexyloxy) thioxanthone, 4,4'-di-(4-isopropylphenoxy)benzophenone, acrylic acid 4-benzoylphenyl ester, 4,4'-diphenylbenzophenone, 4-phenylbenzophenone, and mixtures thereof.

45. A method of polymerizing a polymerizable compound having at least one ethylenically unsaturated double bond, comprising exposing said compound to radiation in the presence of at least one maleimide compound in an amount of about 0.01 to about 2 mole percent and at least one photoactive compound without a maleimide functionality, wherein said maleimide initiates photopolymerization of said ethylenically unsaturated compound and wherein said photoactive compound sensitizes initiation of the ethylenically unsaturated compound by said maleimide, wherein said maleimide compound comprises an alkyl maleimide of the formula

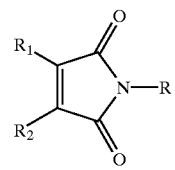

wherein:
each $R_1$ and $R_2$ is independently selected from the group consisting of hydrogen, C1 to C10 alkyl, cycloalkyl, aryl, alkoxy, and halogen, or $R_1$ and $R_2$ together form a fused substituted or unsubstituted saturated or unsaturated five or six membered cyclic hydrocarbon or heterocyclic ring system; and R is straight chain, branched or cyclic C1–C10 alkyl, optionally substituted with one or more C1–C4 alkyl.

46. The method of claim 45, wherein said alkyl maleimide is selected form the group consisting of methyl maleimide, hexyl maleimide, cyclohexyl maleimide, and mixtures thereof.

47. A method of polymerizing a polymerizable compound having at least one ethylenically unsaturated double bond, comprising exposing said compound to radiation in the presence of at least one maleimide compound in an amount of about 0.01 to about 2 mole percent and at least one photoactive benzophenone compound without a maleimide functionality, wherein said maleimide initiates photopolymerization of said ethylenically unsaturated compound and wherein said photoactive benzophenone compound sensitizes initiation of the ethylenically unsaturated compound by said maleimide, wherein said benzophenone compound has the formula

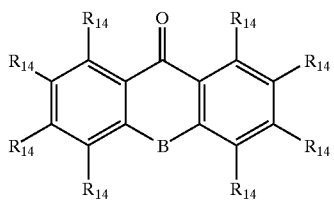

wherein:
B is (H,H), —$CH_2$—, —S—, —O—, —CO—, —$NR_{15}$—, or a bond bridging the two aromatic rings;

each $R_{14}$ is independently selected from the group consisting of hydrogen, alkyl, cycloalkyl, alkoxy, aryl, alkylaryl, arylalkyl, halogen, trihaloalkyl, —CN, —$NO_2$, —$C(O)OR_{15}$, —$C(O)R_{15}$, —$OR_{15}$, —$N(R_{15})_2$, —$OC(O)CR_{15}$=$CHR_{15}$, $R_{16}$, —$OR_{16}$, —$R_{17}$—OC(O)$CR_{15}$=$CHR_{15}$, polymerizable moieties, and oligomeric and polymeric moieties;

$R_{15}$ is selected from the group consisting of hydrogen, alkyl, aryl, cycloalkyl, arylalkyl, and alkylaryl;

$R_{16}$ is one or more saturated or unsaturated five or six membered hydrocarbon or heterocyclic ring system, optionally substituted with one or more alkyl, cycloalkyl, or halogen; and $R_{17}$ is selected from the group consisting of alkyl, aryl, cycloalkyl, arylalkyl, and alkylaryl.

48. A method of polymerizing a polymerizable compound having at least one ethylenically unsaturated double bond, comprising exposing said compound to radiation in the presence of at least one maleimide compound in an amount of about 0.01 to about 2 mole percent and at least one photoactive benzophenone compound without a maleimide functionality, wherein said maleimide initiates photopolymerization of said ethylenically unsaturated compound and wherein said photoactive benzophenone compound sensitizes initiation of the ethylenically unsaturated compound by said maleimide, wherein said benzophenone compound is selected from the group consisting benzophenone, thioxanthone, isopropylthioxanthone, chlorothioxanthone, 4-morpholinobenzophenone, 4,4'-diphenoxybenzophenone, methyl o-benzoylbenzoate, 1-methyl-2-(2-ethylhexyloxy) thioxanthone, 4,4'-di-(4-isopropylphenoxy)benzophenone, acrylic acid 4-benzoylphenyl ester, 4,4'-diphenylbenzophenone, 4-phenylbenzophenone, and mixtures thereof.

49. The method of claim 18, wherein said maleimide compound comprises an aromatic maleimide of the formula

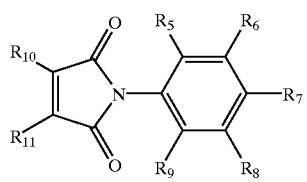

wherein:

each $R_5$, $R_6$, $R_8$, $R_9$, $R_{10}$ and $R_{11}$ is H; and $R_7$ is a spacer group connecting at least two compounds of the above formula to form a di- or multi-functional maleimide.

50. The method of claim 49, wherein said aromatic maleimide is

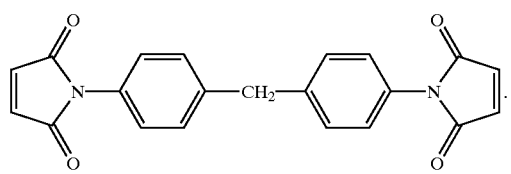

51. The method of claim 18, wherein said photoactive compound comprises a benzophenone compound of the formula

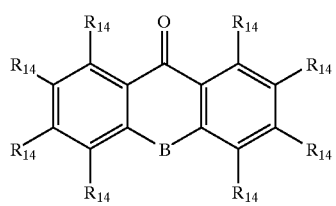

wherein:

B is (H,H);

at least one $R_{14}$ is aryl and the other $R_{14}$ are hydrogen;

$R_{15}$ is selected from the group consisting of hydrogen, alkyl, aryl, cycloalkyl, arylalkyl, and alkylaryl;

$R_{16}$ is one or more saturated or unsaturated five or six membered hydrocarbon or heterocyclic ring system, optionally substituted with one or more alkyl, cycloalkyl, or halogen; and $R_{17}$ is selected from the group consisting of alky, aryl; cycloalkyl, arylalkyl, and alkylaryl.

52. The method of claim 51, wherein said benzophenone compound is 4-phenylbenzophenone.

53. A method of polymerizing a polymerizable compound having at least one ethylenically unsaturated double bond, comprising exposing said compound to radiation in the presence of at least one maleimide compound in an amount of about 0.01 to about 2 mole percent and at least one photoactive benzophenone compound, wherein said maleimide initiates photopolymerization of said ethylenically unsaturated compound and wherein said photoactive benzophenone compound sensitizes initiation of the ethylenically unsaturated compound by said maleimide, wherein said photoactive benzophenone compound comprises a benzophenone compound of the formula

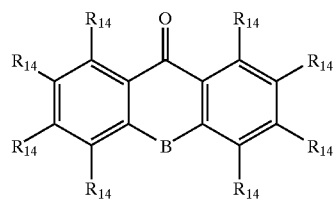

wherein:

B is (H,H);

at least one $R_{14}$ is aryl and the other $R_{14}$ are hydrogen;

$R_{15}$ is selected from the group consisting of hydrogen, alkyl, aryl, cycloalkyl, arylalkyl, and alkylaryl;

$R_{16}$ is one or more saturated or unsaturated five or six membered hydrocarbon or heterocyclic ring system, optionally substituted with one or more alkyl, cycloalkyl, or halogen; and $R_{17}$ is selected from the group consisting of alkyl, aryl, cycloalkyl, arylalkyl, and alkylaryl.

54. The method of claim 53, wherein said benzophenone compound is 4-phenylbenzophenone.

55. The composition of claim 9, wherein said maleimide is present in an amount of about 0.01 to about 2 mole percent.

56. The composition of claim 9, wherein said photoactive compound is a benzophenone compound.

57. The composition of claim 10, wherein said maleimide is present in an amount of about 0.01 to about 2 mole percent.

58. The composition of claim 10, wherein said photoactive compound is a benzophenone compound.

59. The method of claim 26, wherein said maleimide is present in an amount of about 0.01 to about 2 mole percent.

60. The method of claim 26 wherein said photoactive compound is a benzophenone compound.

61. The method of claim 27, wherein said maleimide is present in an amount of about 0.01 to about 2 mole percent.

62. The method of claim 27, wherein said photoactive compound is a benzophenone compound.

63. The composition of claim 41, wherein said photoactive compound is a benzophenone compound.

64. The method of claim 45, wherein said photoactive compound is a benzophenone compound.

* * * * *

UNITED STATES PATENT AND TRADEMARK OFFICE
CERTIFICATE OF CORRECTION

PATENT NO. : 6,555,593 B1  Page 1 of 1
DATED : April 29, 2003
INVENTOR(S) : Hoyle et al.

It is certified that error appears in the above-identified patent and that said Letters Patent is hereby corrected as shown below:

<u>Title page,</u>
Item [56], References Cited, OTHER PUBLICATIONS, reference, "F.C. Deschryver et al" (first instance) "Alkylenedimaleimides" should read -- Alkylenebismaleimides --.
Reference "F.C. DeSchryver et al" (third instance) cancel "K. Meier et al., *J. Photochem.*, 35, 353-366. 1986.";
Reference "Hoyle et al., Polymer Communications", "5696-4697" should read -- 5696-5697 --.

<u>Column 25,</u>
Line 29, after "consisting" cancel the comma (,).

<u>Column 27,</u>
Line 21, "polymnerizable" should read -- polymerizable --.

<u>Column 30,</u>
Line 41, "alkyl)" should read -- alkyl --.

Signed and Sealed this

Ninth Day of September, 2003

JAMES E. ROGAN
*Director of the United States Patent and Trademark Office*